US012323105B2

United States Patent
Wagh et al.

(10) Patent No.: US 12,323,105 B2
(45) Date of Patent: Jun. 3, 2025

(54) STANDBY VOLTAGE CONDITION FOR FAST RF AMPLIFIER BIAS RECOVERY

(71) Applicant: pSemi Corporation, San Diego, CA (US)

(72) Inventors: Poojan Wagh, Sleepy Hollow, IL (US); Kashish Pal, Reading (GB)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 18/656,926

(22) Filed: May 7, 2024

(65) Prior Publication Data

US 2024/0405724 A1    Dec. 5, 2024

Related U.S. Application Data

(63) Continuation of application No. 18/328,987, filed on Jun. 5, 2023, now Pat. No. 11,984,852, which is a
(Continued)

(51) Int. Cl.
*H03F 1/02* (2006.01)
*H03F 1/22* (2006.01)
(Continued)

(52) U.S. Cl.
CPC ........... *H03F 1/0227* (2013.01); *H03F 1/223* (2013.01); *H03F 1/301* (2013.01); *H03F 1/56* (2013.01);
(Continued)

(58) Field of Classification Search
CPC ........ H03F 1/0227; H03F 1/223; H03F 1/301; H03F 1/56; H03F 3/189; H03F 3/193
See application file for complete search history.

(56) References Cited

U.S. PATENT DOCUMENTS 5,012,123 A   4/1991   Ayasli et al.
5,119,042 A   6/1992   Crampton et al.
(Continued)

FOREIGN PATENT DOCUMENTS

FR   3005787 A1   11/2014
WO   01/48828 A1   7/2001
(Continued)

OTHER PUBLICATIONS

Ahmed, et al. "DTX: A Revolutionary Digital Transmitter Technology to Provide Multi-Mode/Multi-Band Capability" Proceeding of the SOR 04 Technical Conference and Product Exposition, 2004, pp. 1-5.
(Continued)

*Primary Examiner* — Patricia T Nguyen
(74) *Attorney, Agent, or Firm* — Steinfl + Bruno LLP

(57) ABSTRACT

Various methods and circuital arrangements for biasing one or more gates of stacked transistors of an amplifier are possible where the amplifier is configured to operate in at least an active mode and a standby mode. Circuital arrangements can reduce bias circuit standby current during operation in the standby mode while allowing a quick recovery to normal operating conditions of the amplifier. Biasing an input transistor of the stacked transistors can be obtained by using a replica stack circuit.

27 Claims, 16 Drawing Sheets

Related U.S. Application Data continuation of application No. 17/950,708, filed on Sep. 22, 2022, now Pat. No. 11,671,058, which is a continuation of application No. 17/074,070, filed on Oct. 19, 2020, now Pat. No. 11,456,705, which is a continuation of application No. 16/283,298, filed on Feb. 22, 2019, now Pat. No. 10,819,288, which is a continuation of application No. PCT/US2017/050839, filed on Sep. 8, 2017, which is a continuation of application No. 15/268,297, filed on Sep. 16, 2016, now Pat. No. 9,837,965.

(51) Int. Cl.
  *H03F 1/30* (2006.01)
  *H03F 1/56* (2006.01)
  *H03F 3/189* (2006.01)
  *H03F 3/193* (2006.01)

(52) U.S. Cl.
  CPC ............. *H03F 3/189* (2013.01); *H03F 3/193* (2013.01); *H03F 2200/18* (2013.01); *H03F 2200/249* (2013.01); *H03F 2200/453* (2013.01)

(56) References Cited

U.S. PATENT DOCUMENTS

| | | | |
|---|---|---|---|
| 5,126,688 A | 6/1992 | Nakanishi et al. | |
| 5,375,256 A | 12/1994 | Yokoyama et al. | |
| 5,489,792 A | 2/1996 | Hu et al. | |
| 5,635,872 A | 6/1997 | Zimmerman | |
| 5,986,507 A | 11/1999 | Itakura et al. | |
| 6,111,462 A | 8/2000 | Mucenieks et al. | |
| 6,137,367 A | 10/2000 | Ezzedine et al. | |
| 6,191,653 B1 | 2/2001 | Camp, Jr. et al. | |
| 6,225,665 B1 | 5/2001 | Hirano | |
| 6,239,657 B1 | 5/2001 | Bauer | |
| 6,242,979 B1 | 6/2001 | Li | |
| 6,281,756 B1 | 8/2001 | Goto et al. | |
| 6,297,696 B1 | 10/2001 | Abdollahian et al. | |
| 6,307,237 B1 | 10/2001 | Erstad | |
| 6,308,047 B1 | 10/2001 | Yamamoto et al. | |
| 6,342,810 B1 | 1/2002 | Wright et al. | |
| 6,366,172 B1 | 4/2002 | Hayashi et al. | |
| 6,380,802 B1 | 4/2002 | Pehike et al. | |
| 6,392,490 B1 | 5/2002 | Gramegna et al. | |
| 6,449,465 B1 | 9/2002 | Gailus et al. | |
| 6,496,074 B1 | 12/2002 | Sowlati | |
| 6,515,547 B2 | 2/2003 | Sowlati | |
| 6,658,265 B1 | 12/2003 | Steel et al. | |
| 6,725,021 B1 | 4/2004 | Anderson et al. | |
| 6,731,175 B1 | 5/2004 | Chen | |
| 6,747,514 B1 | 6/2004 | Aude | |
| 6,804,502 B2 | 10/2004 | Burgener et al. | |
| 6,831,504 B1 | 12/2004 | Holloway et al. | |
| 6,844,776 B2 | 1/2005 | Schell et al. | |
| 6,853,247 B2 | 2/2005 | Weldon | |
| 6,864,750 B2 | 3/2005 | Shigematsu | |
| 6,934,520 B2 | 8/2005 | Rozsypal | |
| 6,943,628 B2 | 9/2005 | Weldon | |
| 7,023,281 B1 | 4/2006 | Ali | |
| 7,043,213 B2 | 5/2006 | Robinson et al. | |
| 7,071,786 B2 | 7/2006 | Inoue et al. | |
| 7,135,919 B2 | 11/2006 | Chen | |
| 7,135,929 B1 | 11/2006 | Costa et al. | |
| 7,161,429 B2 | 1/2007 | Boreysha et al. | |
| 7,248,120 B2 | 7/2007 | Burgener et al. | |
| 7,248,845 B2 | 7/2007 | Dunn | |
| 7,276,976 B2 | 10/2007 | Oh et al. | |
| 7,352,247 B2 | 4/2008 | Oh et al. | |
| 7,382,305 B1 | 6/2008 | Murden et al. | |
| 7,391,269 B2 | 6/2008 | Chiba | |
| 7,440,733 B2 | 10/2008 | Maslennikov et al. | |
| 7,602,243 B2 | 10/2009 | Murao | |
| 7,605,651 B2 | 10/2009 | Ripley et al. | |
| 7,649,418 B2 | 1/2010 | Matsui | |
| 7,684,514 B2 | 3/2010 | Saito et al. | |
| 7,714,660 B2 | 5/2010 | Lesso et al. | |
| 7,714,662 B2 | 5/2010 | Jeong et al. | |
| 7,714,664 B2 | 5/2010 | Kanaya et al. | |
| 7,737,790 B1 | 6/2010 | Chen et al. | |
| 7,739,522 B2 | 6/2010 | Festøe et al. | |
| 7,782,134 B2 | 8/2010 | Drogi et al. | |
| 7,783,269 B2 | 8/2010 | Vinayak et al. | |
| 7,795,968 B1 | 9/2010 | Li et al. | |
| 7,859,243 B2 | 12/2010 | Lorenz | |
| 7,868,697 B2 | 1/2011 | Arai | |
| 7,910,993 B2 | 3/2011 | Brindle et al. | |
| 8,111,104 B2 | 2/2012 | Ahadian et al. | |
| 8,129,787 B2 | 3/2012 | Brindle et al. | |
| 8,390,381 B2 | 3/2013 | Shen | |
| 8,432,224 B1 | 4/2013 | Woo et al. | |
| 8,466,173 B2 | 6/2013 | Lorimer et al. | |
| 8,487,706 B2 | 7/2013 | Li et al. | |
| 8,493,142 B2 | 7/2013 | Tadano | |
| 8,558,614 B2 | 10/2013 | Masuda et al. | |
| 8,643,107 B2 | 2/2014 | Sleight et al. | |
| 8,779,859 B2 | 7/2014 | Su et al. | |
| 8,779,860 B2 | 7/2014 | Jeon et al. | |
| 8,928,415 B2 | 1/2015 | Cha et al. | |
| 9,083,287 B2 | 7/2015 | Papamichail | |
| 9,148,088 B1 | 9/2015 | Ding | |
| 9,160,292 B2 | 10/2015 | Olson et al. | |
| 9,178,493 B1 | 11/2015 | Nobbe | |
| 9,219,445 B2 | 12/2015 | Nobbe et al. | |
| 9,509,263 B2 | 11/2016 | Lam | |
| 9,641,141 B1 * | 5/2017 | Zheng .................. | H03F 3/2171 |
| 9,837,965 B1 | 12/2017 | Wagh et al. | |
| 9,843,293 B1 | 12/2017 | Wagh et al. | |
| 9,874,893 B2 | 1/2018 | Ciubotaru | |
| 9,882,531 B1 | 1/2018 | Willard et al. | |
| 10,181,819 B2 | 1/2019 | Wagh et al. | |
| 10,250,199 B2 | 4/2019 | Klaren et al. | |
| 10,367,453 B2 | 7/2019 | Willard et al. | |
| 10,389,306 B2 | 8/2019 | Wagh et al. | |
| 10,546,747 B2 | 1/2020 | Englekirk et al. | |
| 10,672,726 B2 | 6/2020 | Englekirk et al. | |
| 10,700,642 B2 | 6/2020 | Wagh et al. | |
| 10,784,818 B2 | 9/2020 | Willard et al. | |
| 10,819,288 B2 | 10/2020 | Wagh et al. | |
| 10,938,348 B1 | 3/2021 | Noori | |
| 11,456,705 B2 | 9/2022 | Wagh et al. | |
| 11,671,058 B2 | 6/2023 | Wagh et al. | |
| 11,984,852 B2 | 5/2024 | Wagh et al. | |
| 2002/0158682 A1 | 10/2002 | Conte et al. | |
| 2003/0032396 A1 | 2/2003 | Tsuchiya et al. | |
| 2003/0224743 A1 | 12/2003 | Okada et al. | |
| 2004/0121745 A1 | 6/2004 | Meck | |
| 2004/0135639 A1 | 7/2004 | Maneatis | |
| 2004/0183597 A1 * | 9/2004 | Mitarashi ............ | H03F 3/45192 |
| | | | 330/253 |
| 2004/0245975 A1 | 12/2004 | Tran et al. | |
| 2005/0206454 A1 | 9/2005 | Richard et al. | |
| 2005/0285684 A1 | 12/2005 | Burgener et al. | |
| 2006/0119435 A1 | 6/2006 | Oh et al. | |
| 2006/0209984 A1 | 9/2006 | Kenington | |
| 2006/0226910 A1 * | 10/2006 | Tanoi ...................... | H03F 1/223 |
| | | | 330/296 |
| 2006/0245517 A1 | 11/2006 | Ikedo et al. | |
| 2007/0075784 A1 | 4/2007 | Pettersson et al. | |
| 2007/0229167 A1 * | 10/2007 | Wu ......................... | H03F 1/22 |
| | | | 330/296 |
| 2008/0237713 A1 | 10/2008 | Doumae | |
| 2009/0278610 A1 | 11/2009 | Murji et al. | |
| 2009/0302824 A1 | 12/2009 | Kim et al. | |
| 2010/0244964 A1 * | 9/2010 | Deguchi ............... | H03F 3/3028 |
| | | | 330/277 |
| 2010/0329013 A1 | 12/2010 | Shikata et al. | |
| 2011/0002080 A1 | 1/2011 | Ranta | |
| 2011/0025422 A1 | 2/2011 | Marra et al. | |
| 2011/0043284 A1 | 2/2011 | Zhao et al. | |
| 2011/0070848 A1 | 3/2011 | Ramachandra Reddy | |
| 2011/0181360 A1 | 7/2011 | Li et al. | |
| 2011/0181364 A1 | 7/2011 | Ahadian et al. | |

(56) References Cited

U.S. PATENT DOCUMENTS

| | | |
|---|---|---|
| 2011/0304393 A1 | 12/2011 | Luff |
| 2012/0139643 A1 | 6/2012 | Scott et al. |
| 2012/0169398 A1 | 7/2012 | Brindle et al. |
| 2012/0200338 A1 | 8/2012 | Olson |
| 2012/0267719 A1 | 10/2012 | Brindle et al. |
| 2013/0082782 A1 | 4/2013 | Leuschner et al. |
| 2013/0187712 A1 | 7/2013 | Cabanillas et al. |
| 2013/0222075 A1 | 8/2013 | Reedy et al. |
| 2013/0229235 A1 | 9/2013 | Ohnishi |
| 2013/0310114 A1 | 11/2013 | Zohny et al. |
| 2014/0043102 A1* | 2/2014 | Su .................... H03F 1/223 330/295 |
| 2014/0171010 A1 | 6/2014 | Olson |
| 2014/0184334 A1 | 7/2014 | Nobbe et al. |
| 2014/0184335 A1 | 7/2014 | Nobbe et al. |
| 2014/0184336 A1 | 7/2014 | Nobbe et al. |
| 2014/0184337 A1 | 7/2014 | Nobbe et al. |
| 2014/0210558 A1 | 7/2014 | Matsumoto et al. |
| 2014/0266458 A1 | 9/2014 | Scott et al. |
| 2014/0266460 A1 | 9/2014 | Nobbe et al. |
| 2014/0327483 A1 | 11/2014 | Balteanu |
| 2015/0084695 A1 | 3/2015 | Onizuka |
| 2015/0097624 A1 | 4/2015 | Olson et al. |
| 2015/0236650 A1 | 8/2015 | Deo |
| 2015/0270806 A1 | 9/2015 | Wagh et al. |
| 2015/0280655 A1 | 10/2015 | Nobbe et al. |
| 2015/0280672 A1 | 10/2015 | Ding et al. |
| 2015/0341003 A1 | 11/2015 | Ciubotaru |
| 2016/0126906 A1 | 5/2016 | Maxim et al. |
| 2016/0241235 A1 | 8/2016 | Hasegawa |
| 2017/0047731 A1* | 2/2017 | Manohar .................... H03K 5/08 |
| 2017/0133989 A1 | 5/2017 | Dykstra et al. |
| 2017/0146591 A1 | 5/2017 | Nobbe et al. |
| 2017/0149437 A1 | 5/2017 | Luo et al. |
| 2017/0170177 A1 | 6/2017 | Tasbas et al. |
| 2018/0083577 A1 | 3/2018 | Wagh et al. |
| 2018/0083578 A1 | 3/2018 | Klaren et al. |
| 2018/0131327 A1 | 5/2018 | Wagh et al. |
| 2018/0159475 A1 | 6/2018 | Willard et al. |
| 2018/0262164 A1 | 9/2018 | Ranta et al. |
| 2018/0337043 A1 | 11/2018 | Englekirk et al. |
| 2019/0158029 A1 | 5/2019 | Wagh et al. |
| 2019/0158031 A1 | 5/2019 | Klaren et al. |
| 2019/0190459 A1 | 6/2019 | Wagh et al. |
| 2019/0379330 A1 | 12/2019 | Willard et al. |
| 2020/0036340 A1 | 1/2020 | Yoshimasu et al. |
| 2020/0036341 A1 | 1/2020 | Klaren et al. |
| 2020/0176252 A1 | 6/2020 | Englekirk et al. |
| 2020/0350267 A1 | 11/2020 | Englekirk et al. |
| 2020/0358402 A1 | 11/2020 | Wagh et al. |
| 2021/0067096 A1 | 3/2021 | Willard et al. |
| 2021/0075376 A1 | 3/2021 | Birkbeck |
| 2021/0075377 A1* | 3/2021 | Pal .................... H03F 1/223 |
| 2021/0119583 A1 | 4/2021 | Wagh et al. |
| 2022/0407469 A1 | 12/2022 | Ayranci et al. |
| 2023/0081055 A1 | 3/2023 | Wagh et al. |
| 2023/0396217 A1 | 12/2023 | Wagh et al. |

FOREIGN PATENT DOCUMENTS

| | | |
|---|---|---|
| WO | 2009/108391 A1 | 9/2009 |
| WO | 2018/052460 A1 | 3/2018 |
| WO | 2018/052539 A1 | 3/2018 |
| WO | 2018/052817 A1 | 3/2018 |

OTHER PUBLICATIONS

Aoki, Ichiro, et al., "Fully Integrated CMOS Power Amplifier Design Using the Distributed Active-Transformer Architecture", IEEE Journal of Solid-State Circuits, vol. 37, No. 3, Mar. 2002, pp. 371-383.

Asbeck, et al. "CMOS Handset Power Amplifiers: Directions for the Future" IEEE, 2012, 6 pgs.

Asbeck, et al. "Design Options for High Efficiency Linear Handset Power Amplifiers" IEEE, 2009, pp. 1-4.

Asbeck, et al. "Si IC Development for High Efficiency Envelope Tracking Power Amplifiers" SiRF, IEEE, 2012, pp. 1-4.

Bernstein, et al., "SOI Circuit Design Concepts", Kluwer Academic Publishers, 2000, pp. 22-23.

Bult, et al., "The CMOS Gain-Boosting Technique", Philips Research Laboratories, Eindhoven, The Netherlands, J.H. Huijsing, et al., Analog Circuit Design, 1993, 26 pgs.

Ding, Yongwang, et al., "A High-Efficiency CMOS +22-dBm Linear Power Amplifier", IEEE Journal of Solid-State Circuits, vol. 40, No. 9, Sep. 2005, pp. 1895-1900.

Ezzeddine, et al., "The High Voltage/High Power FET (HiVP1)", 2003 IEEE Radio Frequency Integrated Circuits Symposium, pp. 215-218.

Geynet, L. et al. "Fully-Integrated Multi-Standard VCOs with switched LC tank and Power Controlled by Body Voltage in 130nm Cmos/Soi" IEEE Radio Frequency Integrated Circuits (RFIC) Symposium, Jun. 2006, pp. 1-4.

Hassan, et al., "A Combined Series-Parallel Hybrid Envelope Amplifier for Envelope Tracking Mobile Terminal RF Power Amplifier Applications", IEEE Journal of Solid-State Circuits, vol. 47, No. 5, May 2012, 14 pgs.

Hassan, et al., "An Envelope-Tracking CMOS-SOS Power Amplifier with 50% Overall PAE and 29.3 dBm Output Power for LTE Applications." Compound Semiconductor Integrated Circuit Symposium (CSICS), Oct. 2012, 4 pgs.

Hsu, et al., "Comparison of Conventional and Thermally-Stable Cascode (TSC) AlGaAs/GaAs HBTs for Microwave Power Applications", Jrnl of Solid-State Electronics, V. 43, Sep. 1999, 2 pages.

Jeon, et al., "A New "Active" Predistorter with High Gain Using Cascode-FET Structures", IEEE Radio Frequency Integrated Circuits Symposium, 2002, pp. 253-256.

Jeong, J. et al. "A 20 dBm Linear RF Power Amplifier Using Stacked Silicon-on-Sapphire MOSFETs." IEEE Microwave and Wireless Components Letters, vol. 16 (12), Dec. 2006, pp. 684-686.

Kavousian, et al. "A Digitally Modulated Polar Cmos Pa with 20MHz Signal Bw." IEEE International Solid-States Circuits Conference, Feb. 12, 2007, Session 4, RF Building Blocks, 4.1, 3 pgs.

Kim, Bonkee, et al., "A New Linearization Technique for Mosfet Rf Amplifier using Multiple Gated Transistors", IEEE Micro. and Guided Wave Ltrs, V. 10, No. 9, Sep. 2000, 371-373.

Kim, et al. "Efficiently Amplified", IEEE Microwave Magazine, Aug. 2010, pp. 87-100.

Kim, et al., "High-Performance V-Band Cascode HEMT Mixer and Downconverter Module", IEEE Transactions on Microwave Theory and Techniques, vol. 51, No. 3, p. 805-810, Mar. 2003.

Kim, et al. "Push the Envelope." IEEE Microwave Magazine, IMS Special Issue, May 2013, pp. 68-81.

Ko, Sangwon, et al., "A Linearized Cascode CMOS Power Amplifier", Electrical and Computer Engineering Dept., Univ. of Florida, IEEE, 2006, 4 pgs.

Lai, P.W. and Long, S.I. "A 5GHz CMOS Low Phase Noise Transformer Power Combining VCO." IEEE Radio Frequency Integrated Circuits (RFIC) Symposium, Jun. 2006, pp. 1-4.

Lester F. Eastman, P. I., "High Power, Broadband, Linear, Solid State Amplifier", 16th Quarterly Rep. under MURI Contract No. N00014-96-1-1223 for period Jun. 1, 2000-Aug. 31, 00, Sep. 2000, 8 pages.

Li et al. "Design of High Efficiency Monolithic Power Amplifier With Envelope-Tracking and Transistor Resizing for Broadband Wireless Applications" IEEE Journal of Solid-Slate Circuits, vol. 47, No. 9, Sep. 2012, pp. 1-12.

McCune, Earl. "Microwave Bytes: Envelope Tracking or Polar—Which is it?" IEEE Microwave Magazine, Jun. 2012, pp. 34-56.

McRory, John, et al., "Transformer Coupled Stacked FET Power Amplifiers", IEEE Journal of Solid-State Circuits, vol. 34, No. 2, Feb. 1999, pp. 157-161.

Mishra, et al., "High Power Broadband Amplifiers for 1-18 GHz Naval Radar" University of California, Santa Barbara, pp. 1-9, Jul. 1, 1998.

MIT Lincoln Laboratory, "MITLL Low-Power FDSOI CMOS Process" Application Notes, Jun. 2006, 40 pgs.

(56) References Cited

OTHER PUBLICATIONS

Moon, et al. "Highly Efficient Saturated Power Amplifier" IEEE Microwave Magazine, Jan./Feb. 2012, pp. 125-131.
Nelson Pass, Pass Labs, "Cascode Amp Design", Audio Electronics, pp. 1-4, Mar. 1978.
Nujira Ltd. "Envelope Tracking: unlocking the potential of CMOS Pas in 4G Smartphones." White Paper, Feb. 2013, 9 pgs.
P1911-US2C4 1.98(d) statement + List - Jan. 18, 2025. 1 page.
Pornpromlikit Set Al: A Watt-Level Stacked-FET Linear Power Amplifier in Silicon- on-Insulator CMOS11 , IEEE Transactions On Microwave Theory and Techniques, IEEE Service Center, Piscataway, NJ, US, vol. 58, No. 1, Jan. 1, 2010 (Jan. 1, 2010), pp. 57-64, XP011298273, ISSN: 0018-9480.
Raab, et al., "Power Amplifiers and Transmitters for RF and Microwave", IEEE Transactions on Microwave Theory and Techniques, vol. 50, No. 3, pp. 814-826, Mar. 2002, USA.
Ren, John Z., "Low Voltage Soi Mosfet with Suppressed Floating Body Effects", Department of Electrical and Computer Engineering, University of Toronto, 1999, 81 pgs.
Sahu, et al., "A High Efficiency WCDMA RF Power Amplifier with Adaptive, Dual-Mode Buck-Boost Supply and Bias-Current Control", Manuscript received on May 9, 2006, revised on Sep. 1, 2006, IEEE, pp. 1-3.
Shifrin, M.B., et al. "Monolithic FET structures for High-Power Control Component Applications," IEEE Transactions on Microwave Theory and Techniques, vol. 37, No. 12. Dec. 1989. pp. 2134-2141. doi: 10.1109/22.44132.
Sowlati, Tirdad, "A 2.4-GHz 0/18-um CMOS Self-Biased Cascode Power Amplifier", IEEE Journal or Solid-State Circuits, vol. 38, No. 8, Aug. 2003, pp. 1318-1324.
Ueda, et al., "A 5GHZ-Band On-Chip Matching CMOS MMIC Front-End", 11th GAAS Symposium—Munich 2003, pp. 101-104, Germany.
Van Der Heijden, Mark, et al., "Theory and Design of an Ultra-Linear Square-Law Approximated LDMOS Power Amplifier in Class-AB Operation", IEEE Transactions on Microwave Theory and Techniques, vol. 50, No. 9, Sep. 2002, pp. 2176-2184.
Webster, Danny, et al., "Control of Circuit Distortion by the Derivative Superposition Method", IEEE Microwave and Guided Wave Letter, vol. 6, No. 3, Mar. 1996, pp. 123-125.
Webster, D.R., et al., "Novel Circuit Synthesis Technique using Short Channel GaAs FETS Giving Reduced Intermodulation Distortion", Dept. of Electronic and Electrical Engineering, University College, London, IEEE 1995, pp. 1348-1351.
Wimpenny, et al. "Envelope Tracking GaAs Hbt Pa performance characterization under high load mismatch conditions" Pawr, IEEE, 2012, pp. 37-40.

\* cited by examiner

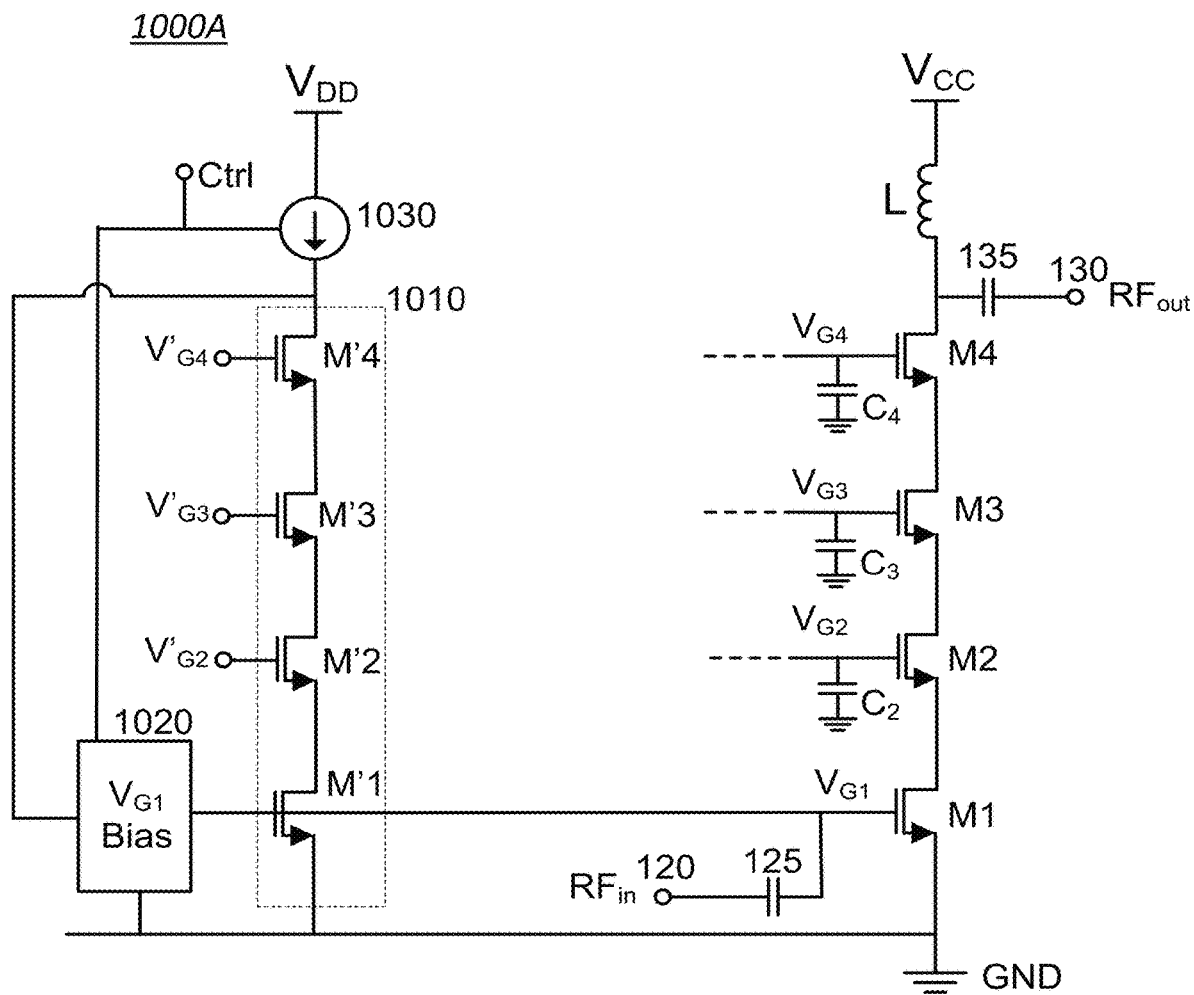
FIG. 10A    *Prior Art*

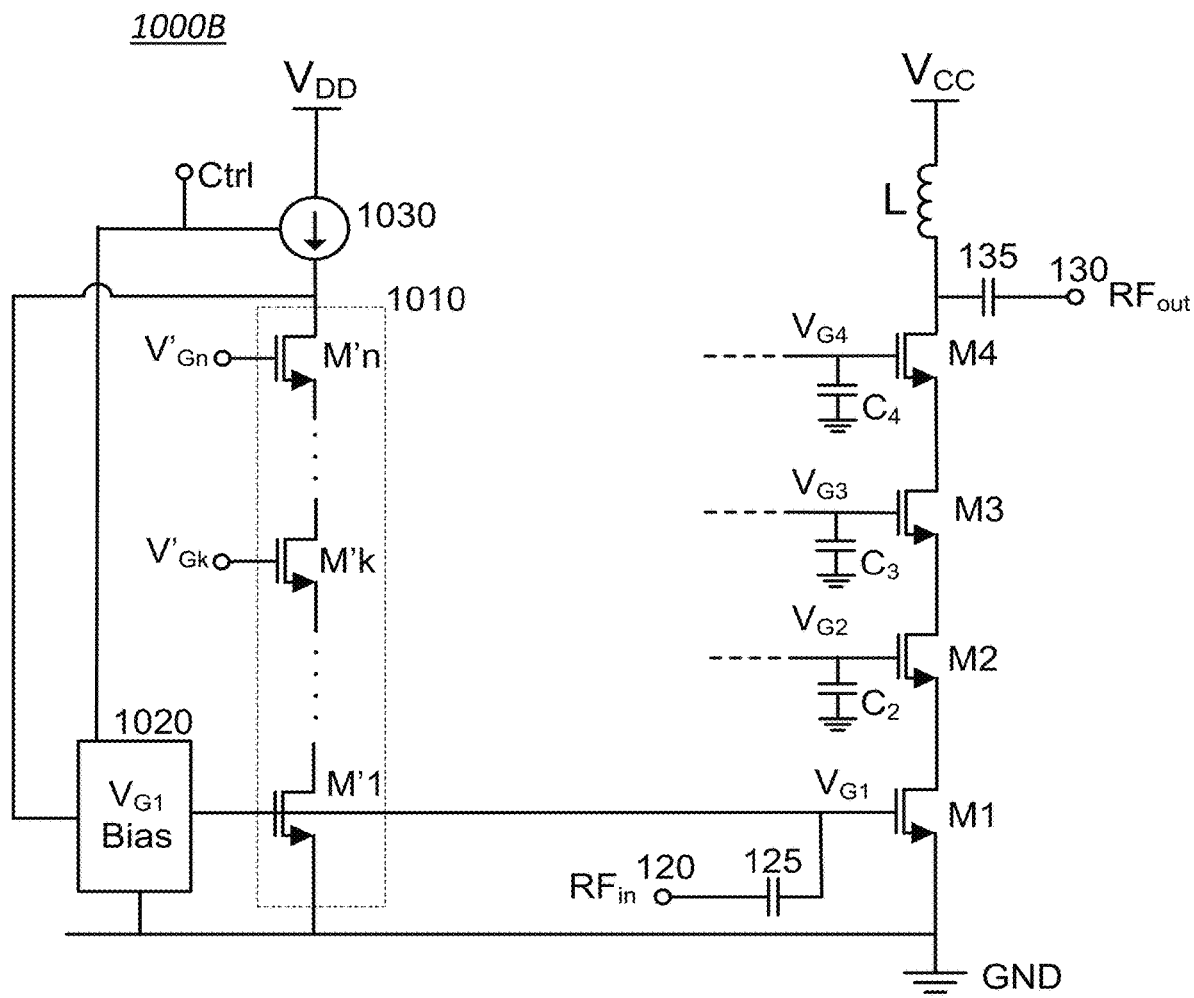
FIG. 10B          *Prior Art*

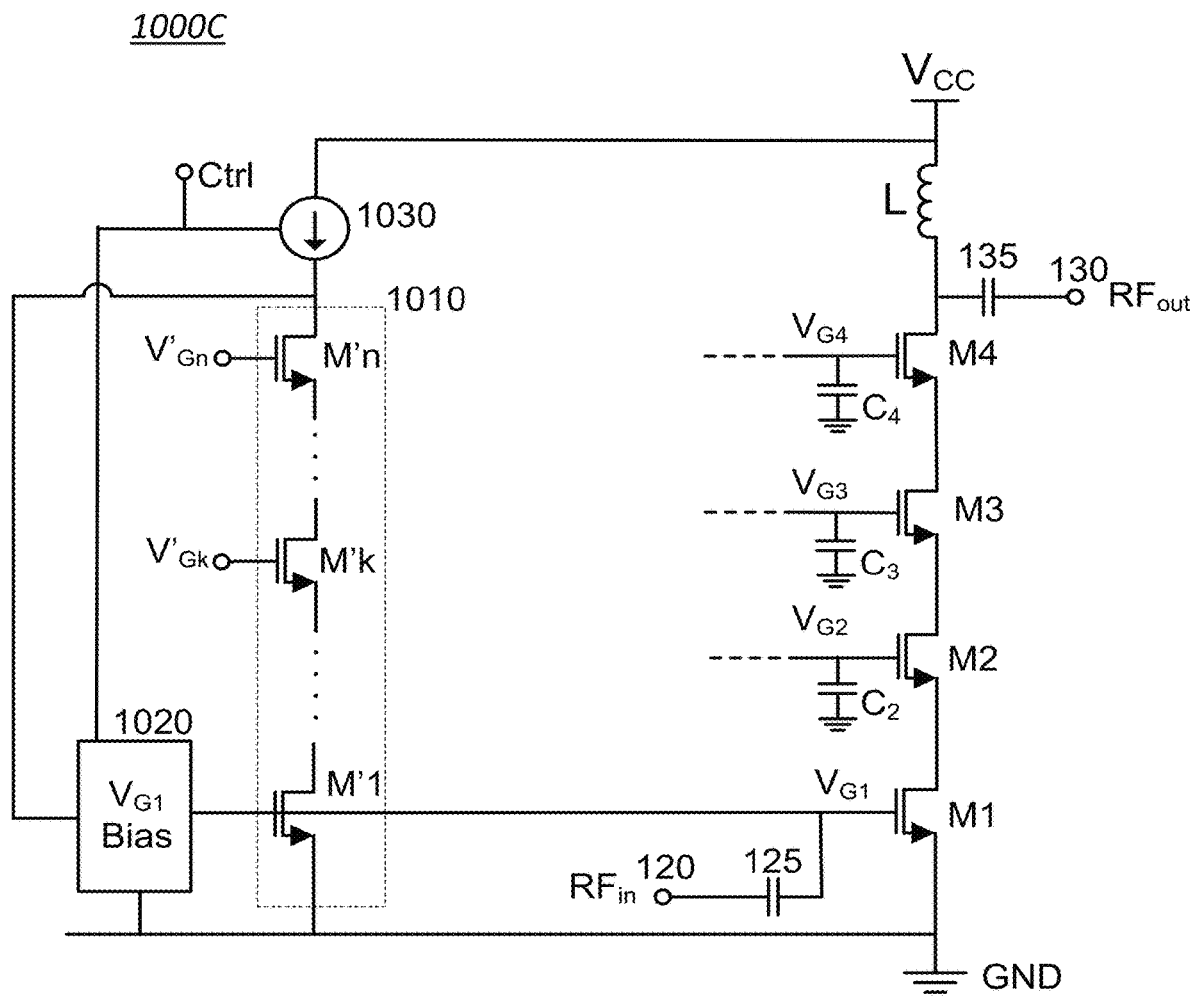
FIG. 10C    *Prior Art*

500
STANDBY VOLTAGE CONDITION FOR FAST RF AMPLIFIER BIAS RECOVERY

CROSS REFERENCE TO RELATED APPLICATIONS—CLAIM OF PRIORITY

The present application is a continuation of U.S. Non-Provisional application Ser. No. 18/328,987 filed on Jun. 5, 2023, to issue as U.S. Pat. No. 11,984,852 on May 14, 2024, which in turn is a continuation of U.S. Non-Provisional application Ser. No. 17/950,708 filed on Sep. 22, 2022, issued as U.S. Pat. No. 11,671,058 on Jun. 6, 2023, which in turn is a continuation of U.S. Non-Provisional application Ser. No. 17/074,070 filed on Oct. 19, 2020, issued as U.S. Pat. No. 11,456,705 on Sep. 27, 2022, which in turn is a continuation of U.S. Non-Provisional application Ser. No. 16/283,298 filed on Feb. 22, 2019, now U.S. Pat. No. 10,819,288, issued Oct. 27, 2020, which in turn is a continuation of International Patent Application PCT/US2017/050839 filed on Sep. 8, 2017, which in turn is a continuation of U.S. Non-Provisional application Ser. No. 15/268,297 filed on Sep. 16, 2016 (now U.S. Pat. No. 9,837,965 issued Dec. 5, 2017), the disclosures of all of which are incorporated herein by reference in their entirety.

The present application may be related to U.S. Pat. No. 7,248,120, issued on Jul. 24, 2007, entitled "Stacked Transistor Method and Apparatus", the disclosure of which is incorporated herein by reference in its entirety. The present application may also be related to Published US Application No. 2015/0270806 A1, published Sep. 24, 2015, entitled "Bias Control for Stacked Transistor Configuration", the disclosure of which is incorporated herein by reference in its entirety. The present application may also be related to Published US Application No. US 2014/0184336 A1, published Jul. 3, 2014, entitled "Amplifier Dynamic Bias Adjustment for Envelope Tracking", the disclosure of which is incorporated herein by reference in its entirety. The present application may also be related to U.S. Pat. No. 9,219,445 entitled "Optimization Methods for Amplifiers with Variable Supply Power", issued Dec. 22, 2015, the disclosure of which is incorporated herein by reference in its entirety. The present application may also be related to U.S. Pat. No. 8,487,706 B2 entitled "Stacked Linear Power Amplifier with Capacitor Feedback and Resistor Isolation", issued Jul. 16, 2013, the disclosure of which is incorporated herein by reference in its entirety. The present application may also be related to U.S. patent application Ser. No. 14/945,323, filed on Nov. 18, 2015, entitled "Butted Body Contact for SOI Transistor", the disclosure of which is incorporated herein by reference in its entirety. The present application may also be related to U.S. patent application Ser. No. 15/078,930, filed on Mar. 23, 2016, entitled "Butted Body Contact for SOI Transistor", issuing on Dec. 12, 2017 as U.S. Pat. No. 9,842,858, the disclosure of which is incorporated herein by reference in its entirety. The present application may also be related to U.S. Pat. No. 9,882,531 issuing on Jan. 30, 2018 entitled "Body Tie Optimization for Stacked Transistor Amplifier", the disclosure of which is incorporated herein by reference in its entirety.

BACKGROUND

1. Field

The present application relates to amplifiers. In particular the present application relates to gate biasing for amplifiers comprising stacked transistors which can operate in an active mode during periods of RF signal transmission, and in a standby mode during periods of non-transmission. Issues and solutions related to switching from operation in the standby mode to operation in the active mode are presented.

2. Description of Related Art

In recent years, stacked cascode amplifiers, which use a plurality of transistors arranged as a stack (stacked transistors) in an amplification stage of the amplifiers, have become predominant in radio frequency (RF) applications where high power, high voltage outputs are desired. Due to the higher number of transistors in the stack, voltage handling performance of the amplifier is increased, thereby allowing the high power, high voltage outputs. Since the stacked transistors comprise individual low voltage transistors which can tolerate a voltage substantially lower than the output voltage of the amplifier, it is important to bias the low voltage transistors of the stack so as to maintain operation within their tolerable voltage range. Such voltage compliance of the low voltage transistors of the stack must be maintained whether the amplifier operates in an active mode, transmitting a signal, or in a standby mode, not transmitting a signal. In cases where replica circuits, which are scaled down versions of the stacked transistors used in the amplification stage, are used to generate biasing voltages for the amplification stage, it may be desirable to reduce power consumption through such replica circuits and related auxiliary circuits during the standby mode. However, conflicting characteristics of a biasing circuit that provides biasing voltages to the stacked transistors may exist between operation in the active mode and in the standby mode, such as, for example, an impedance presented to the gates of the transistors of the stack during the active mode of operation, a power consumed in the biasing circuit during the standby mode of operation, and a recovery speed of the biasing voltages from operation in the standby mode to operation in the active mode.

SUMMARY

The various teachings according to the present disclosure describe biasing circuits for providing biasing voltages of the stacked transistors that have different characteristics between the active mode and the standby mode, while maintaining voltage compliance of the low voltage transistors of the stack for safe operation in both modes of operation, and allowing fast recovery of the biasing voltages from operation in the standby mode to operation in the active mode.

According to a first aspect of the present disclosure, a circuital arrangement is presented, the circuital arrangement comprising: a transistor stack configured to operate as an amplifier, the transistor stack comprising a plurality of stacked transistors comprising an input transistor and an output transistor, the transistor stack configured to operate between a first supply voltage coupled to the output transistor and a reference voltage coupled to the input transistor; a biasing circuit comprising a replica circuit of the transistor stack, the biasing circuit configured to provide an input gate biasing voltage to the input transistor and to a corresponding first transistor of the replica circuit, the replica circuit configured to operate between a second supply voltage coupled to a last transistor of the replica circuit in correspondence of the output transistor, and the reference voltage coupled to the first transistor, wherein the circuital arrangement is configured to operate in at least a first mode and a second mode, wherein during operation in the first mode, the biasing circuit: couples the last transistor of the replica circuit to the second supply voltage through a reference current source that generates a reference current, and regulates the input gate biasing voltage so as the reference current is conducted through the replica circuit, and wherein during operation in the second mode, the biasing circuit: sets the input gate biasing voltage to a voltage so as essentially no current is conducted though the replica circuit, deactivates the reference current source, and resistively couples the last transistor of the replica circuit to the second supply voltage.

According to a second aspect of the present disclosure, a method for biasing a transistor stack configured to operate as an amplifier using a replica circuit of the transistor stack is presented, the method comprising: during a first mode of operation of the amplifier: generating a reference current through a current source; coupling, through the current source, a supply voltage to the replica circuit; regulating a biasing voltage of an input transistor of the transistor stack; based on the regulating, conducting the reference current though the replica circuit; and during a second mode of operation of the amplifier: setting the biasing voltage to a fixed value so as essentially no current is conducted through the replica circuit; deactivating the current source; and resistively coupling the supply voltage to the replica circuit.

According to a third aspect of the present disclosure, a circuital arrangement is presented, the circuital arrangement comprising: a transistor stack configured to operate as an amplifier, the transistor stack comprising a plurality of stacked transistors comprising an input transistor and an output transistor; a biasing circuit comprising a replica circuit of the transistor stack, the biasing circuit configured to provide an input gate biasing voltage to the input transistor and to a corresponding first transistor of the replica circuit, wherein the circuital arrangement is configured to operate in at least an active mode for amplification of a radio frequency (RF) signal through the transistor stack, and a standby mode for essentially no current conduction through the transistor stack and for a reduced power consumption of the circuital arrangement, wherein during operation in the active mode, the biasing circuit is configured to generate the input gate biasing voltage based on a reference current conducted through the replica circuit, and wherein the biasing circuit is configured to generate biasing voltages to transistors of the replica circuit that are substantially equal to biasing voltages to transistors of the transistor stack during both the active mode of operation and the standby mode of operation.

According to a fourth aspect of the present disclosure, a method for biasing a transistor stack configured to operate as an amplifier using a replica circuit of the transistor stack is presented, the method comprising: during an active amplification mode of operation of the amplifier: regulating a biasing voltage to an input transistor of the transistor stack by conducting a reference current through the replica circuit; and providing biasing voltages to transistors of the replica circuit that are substantially equal to biasing voltages provided to transistors of the transistor stack; and during a standby mode of operation of the amplifier: setting the biasing voltage to the input transistor to a fixed value so as essentially no current is conducted through the replica circuit; and providing biasing voltages to the transistors of the replica circuit that are substantially equal to biasing voltages provided to the transistors of the transistor stack

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 10A shows a prior art embodiment of a simplified biasing circuit for biasing a gate of an input transistor of stacked transistors used in an amplification stage, where a replica circuit is used in the biasing circuit.

FIG. 10B shows an alternative prior art embodiment of the simplified biasing circuit of FIG. 10A, where a number of stacked transistors in the replica circuit is different from a number of stacked transistors used in the amplification stage.

FIG. 10C shows an alternative prior art embodiment of the simplified biasing circuit of FIG. 10B, where a same supply voltage is provided to both the stacked transistors used in the amplification stage and the replica circuit.

Like reference numbers and designations in the various drawings indicate like elements.

DETAILED DESCRIPTION

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Figure 1:
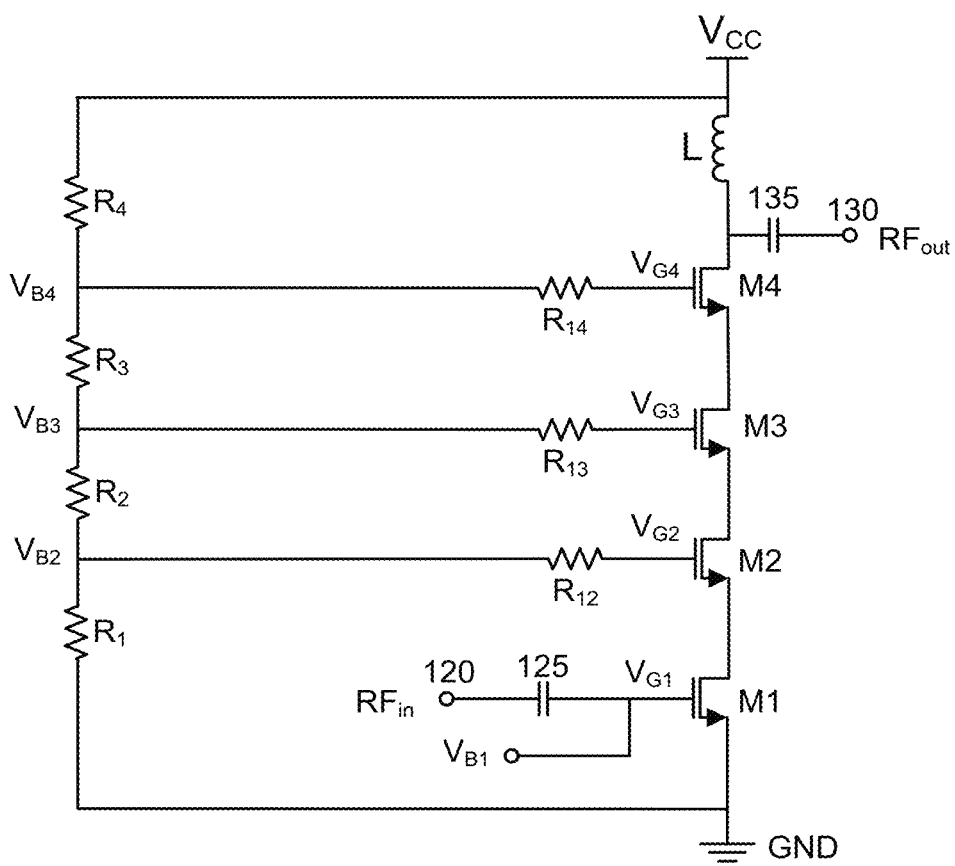
FIG. 1 shows a prior art embodiment of a stacked transistor amplifier where a resistive ladder network is used to provide biasing voltages to the gates of the transistors of the stack.

FIG. 1 shows a simplified schematic of a prior art stacked cascode (RF) amplifier (100). By way of example and not of limitation, the stacked cascode amplifier (100) can comprise a stack of FET transistors (M1, M2, M3, M4) that include an input transistor M1, cascode transistors (M4, M3, M2), and an output transistor M4. An input RF signal, $RF_{in}$, provided at an input terminal (120) of the amplifier (100) is routed to a gate of the input transistor, M1, and is amplified by the amplifier (100). A corresponding amplified output RF signal, $RF_{out}$, is provided at a drain of the output transistor, M4, and routed to an output terminal (130) of the amplifier. Bypass capacitors (125, 135) can be used to decouple low frequency (e.g., DC) biasing voltages provided to the stack of transistors (transistor stack) from the $RF_{in}$ and $RF_{out}$ signals. A supply voltage, $V_{CC}$, is provided to the drain of the output transistor, M4, through an inductor, L, and a reference voltage (e.g., GND) is connected to a source of the input transistor M1. Biasing voltages ($V_{G4}$, $V_{G3}$, $V_{G2}$) at the gates of the cascode transistors (M4, M3, M2) are provided by way of a resistive ladder network (R4, R3, R2, R1) coupled between the supply voltage, $V_{CC}$, and the reference voltage, GND. Nodes ($V_{B4}$, $V_{B3}$, $V_{B2}$) of the resistive ladder network (R4, R3, R2, R1) that connect any two resistors of the resistive ladder network are coupled to respective gates of the cascode transistors (M4, M3, M2) via series resistors (R14, R13, R12) to provide the biasing voltages ($V_{G4}$, $V_{G3}$, $V_{G2}$). As can be seen in FIG. 1, the resistive ladder network (R4, R3, R2, R1) is not used to provide a gate biasing voltage, $V_{G1}$, of the input transistor M1. Instead, a biasing voltage to the input transistor, M1, can be provided at the node $V_{B1}$. Various biasing circuits to generate such gate voltage are described, for example, in the above referenced Published US Application No. 2015/0270806, and Published US Application No. US 2014/0184336 A1, which can be further modified according to the teachings of the present disclosure described with reference to FIG. 10A and FIG. 11.

A person skilled in the art would know that FET transistors (M1, M2, M3, M4) are configured as a four-stage cascode amplifier. Teachings from other documents, such as the above referenced U.S. Pat. No. 8,487,706 B2, further describe stacked cascode amplifiers and methods to minimize output signal distortion by way, for example, of biasing the various gates of the transistors within the stack. The person skilled in the art may use these teaching for further specifics on multi-stage stacked transistors in a cascode configuration, where the stack of FET transistors comprises a number of transistors different from four.

Although the amplifier (100) of FIG. 1 is shown to be powered by a fixed supply voltage $V_{CC}$, other configurations of the amplifier (100) where the supply voltage is variable can also be envisioned. In some exemplary configurations, the supply voltage can be a voltage regulator, or a DC-DC converter. In further exemplary configurations, the supply voltage can vary under control of an external control signal. In some configurations, the control signal can be a function of an envelope signal of the input RF signal, $RF_{in}$, or the output RF signal, $RF_{out}$. Detailed description of biasing methods and apparatus for stacked transistor amplifiers operating from a variable supply voltage can be found, for example, in the above referenced Published US Application No. US 2014/0184336 A1, Published US Application No. 2015/0270806 A1, and U.S. Pat. No. 9,219,445, the disclosures of which are incorporated herein by reference in their entirety. A person skilled in the art would also know of configurations where the supply to the amplifier is in the form of a current source instead of the exemplary voltage source (e.g. $V_{CC}$) discussed in the present disclosure. The teachings according to the present disclosure equally apply to such diverse supply configurations. The exemplary case of a fixed supply discussed in the present disclosure should not be considered as limiting what the applicant considers to be the invention.

Although N-type MOSFETs are used to describe the embodiments in the present disclosure, a person skilled in the art would recognize that other types of transistors such as, for example, P-type MOSFETs and bipolar junction transistors (BJTs) can be used instead or in combination with the N-type MOSFETs. Furthermore, a person skilled in the art will also appreciate the advantage of stacking more than two transistors, such as three, four, five or more, provide on the voltage handling performance of the amplifier. This can for example be achieved when using non bulk-Silicon technology, such as insulated Silicon-on-Sapphire technology. In general, individual devices in the stack can be constructed using CMOS, silicon germanium (SiGe), gallium arsenide (GaAs), gallium nitride (GaN), bipolar transistors, or any other viable semiconductor technology and architecture known. Additionally, different device sizes and types can be used within the stack of devices.

The present disclosure describes methods and arrangements for biasing stacked transistor amplifiers, where the amplifiers are configured to operate in an active mode to transmit an RF signal and in standby mode where no signal is transmitted. Such amplifiers may be used within mobile handsets for current communication systems (e.g. WCMDA, LTE, WiFi, etc.) wherein amplification of signals with frequency content of above 100 MHz and at power levels of above 50 mW is required. Such amplifiers may also be used to transmit power at frequencies and to loads as dictated by downstream splitters, cables, or feed network(s) used in delivering cable television service to a consumer, a next amplifier in an RF chain at a cellular base station; or a beam forming network in a phased array radar system, and other. The skilled person may find other suitable implementations for the present disclosure, targeted at lower (e.g. audio) frequency systems as well, such as audio drivers, high bandwidth laser drivers and similar. As such, it is envisioned that the teachings of the present disclosure will extend to amplification of signals with frequency content of below 100 MHz as well.

With further reference to the amplifier (100) depicted in FIG. 1, the biasing voltages ($V_{G4}$, $V_{G3}$, $V_{G2}$) are such that each transistor (M4, M3, M2, M1) of the stack is biased according to a voltage compliance of the transistor. In other words, a voltage across any two terminals (e.g., gate, source, drain) of the transistor is within a safe operating range of the transistor. As failure of transistor can be a statistical function of applied voltages across the transistors, even when such voltages are within the safe operating range, in some embodiments it may be desirable to subject the transistors of the stack to same voltage ranges so as to provide an equal life expectancy (e.g., mean time before failure) for each transistor of the stack. Accordingly, the gate biasing voltages ($V_{G4}$, $V_{G3}$, $V_{G2}$) can be configured to evenly distribute the voltage across the transistor stack, $V_{CC}$, amongst the stacked transistors (M4, M3, M2, M1). In other words, a drain to source voltage, $V_{DS}$, of each transistor (M4, M3, M2, M1) of the stack is made to be substantially equal to a quarter (¼) of the voltage provided by the supply voltage $V_{CC}$. This can be done, for example, as described in the above referenced Published US Application No. 2015/0270806 A1, whose disclosure is incorporated herein by reference in its entirety, by biasing the gates of the transistors (M4, M3, M2) with respective biasing voltages ($V_{G4}$, $V_{G3}$, $V_{G2}$) equal to $V_{CC} \times$ ¾+$V_{GS}$, $V_{CC} \times$ ²⁄₄+$V_{GS}$, and $V_{CC} \times$ ¼+$V_{GS}$.

A person skilled in the art would understand that during operation of the amplifier (100), an amplified RF signal at the drain of the output transistor (M4) can be at a voltage level substantially higher than the $V_{CC}$ supply voltage. This means that if the gate voltage $V_{G4}$ of the output transistor M4 is maintained to the biasing voltage level provided by the resistive ladder network (R4, R3, R2, R1) discussed above, and therefore the source of M4 is maintained to $V_{CC} \times$ ¾+$V_{GS}$, then the drain to source voltage, $V_{DS}$, of the output transistor M4 can be subjected to higher voltage excursions, which can be beyond the tolerable voltage range of the transistor.

Figure 2:
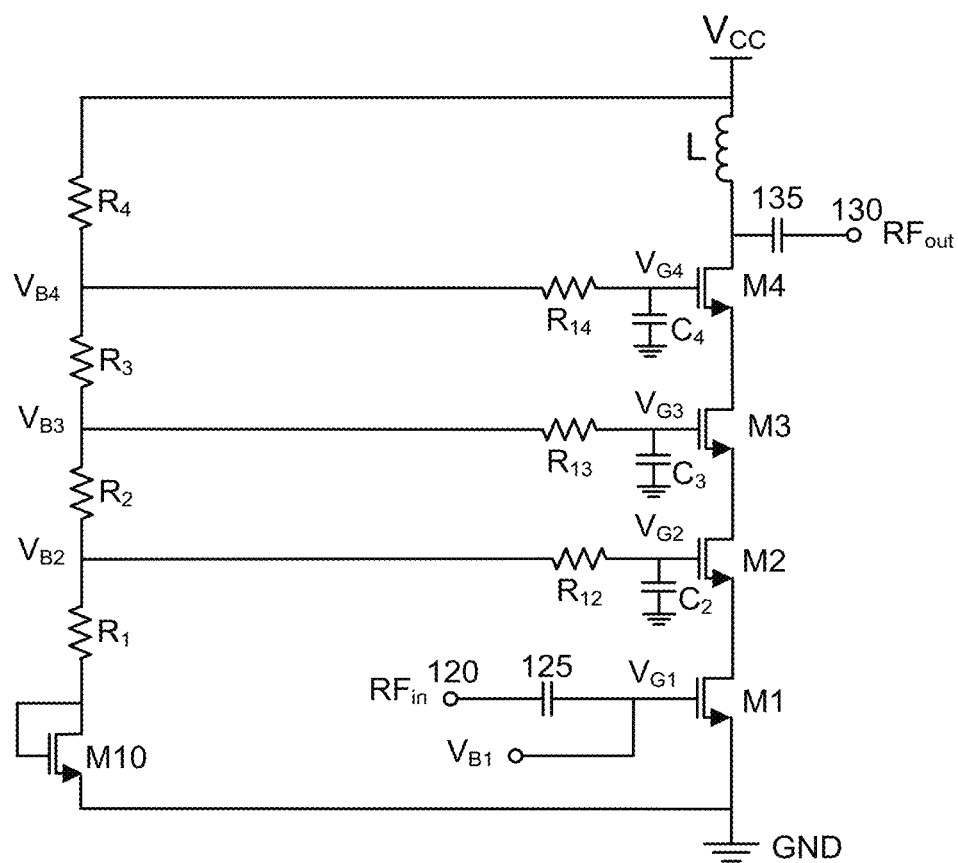
FIG. 2 shows a prior art embodiment of a stacked transistor amplifier similar to the prior art embodiment depicted in FIG. 1, where a diode connected resistor is used to reduce variation of the biasing voltages, and gate capacitors are used to allow voltages at the gates of the transistors of the stack to vary along with an RF signal at the drains of the transistor.

Based on the above, it can be desirable to control the stress on the individual transistors of the stack, due to unequal voltage division of the voltage at the drain of the output transistor M4 across the transistors (M4, M3, M2, M1), which may subject any one of the transistors to a voltage beyond the tolerable voltage range of the transistor (e.g. close to or larger than its limit breakdown voltage). This can be accomplished by configuring the gates of the transistors (M4, M3, M2) of the stack to float via insertion of a gate capacitor ($C_4$, $C_3$, $C_2$) as depicted in FIG. 2. The value of the gate capacitor is chosen so to allow the gate voltage to vary along (float) with the RF signal at the drain of the corresponding transistor, which consequently allows control of the voltage drop (e.g., $V_{DS}$) across the corresponding transistor, thus controlling the conduction of the transistor in accordance to the voltage at its drain, for a more efficient operation of the transistor. Teachings about this floating technique, also referred to as conduction controlling circuit, can be found in the above referenced U.S. Pat. No. 7,248,120, which is incorporated herein by reference in its entirety As the gate capacitors ($C_4$, $C_3$, $C_2$) depicted in FIG. 2 allow coupling of the RF signal at the gates of the transistors (M4, M3, M2), such coupling may negatively influence operation of the biasing circuit provided by the resistive ladder network (R4, R3, R2, R1) as various harmonics of the RF signal, including harmonics at lower frequencies, can alter the operating bias voltages provided by the biasing circuit. As a person skilled in the art would understand, the coupled RF signal, and corresponding harmonics, at a gate of a transistor (e.g., M4, M3, M2) can generate small currents that when fed to an output impedance of the biasing circuit presented to the gate of the transistor, can generate a corresponding voltage at frequencies substantially lower than the frequency of the RF signal. Specifically, if the output impedance of the biasing circuit is large enough, such small currents can generate a large enough low frequency voltage that adds to the biasing voltage to negatively influence operation of the amplifier. As the output impedance of the biasing circuit is a function of resistance values of the resistors (R4, R3, R2, R1), reducing the effects of the RF coupling in the prior art amplifier (200) depicted in FIG. 2 is performed by choosing such values to be smaller. In turn, such small resistance values of the resistors (R4, R3, R2, R1) can require higher biasing currents from the supply voltage $V_{CC}$ to provide the desired gate biasing voltages for the transistors (M4, M3, M2), as compared to choosing higher resistance values (and being subjected to higher levels of the RF coupling). According to some embodiments the impedance (e.g. resistance) of the biasing circuit presented to the gates of the transistors (M4, M3, M2) is substantially of a same value, although other configurations are also possible where an imbalance in the presented impedances exists.

With continued reference to the amplifier (200) of FIG. 2, the desire to reduce the coupling of the RF signal to the basing circuit that generates the gate biasing voltages of the transistors (M4, M3, M2), can increase power dissipation in the resistive ladder network (R4, R3, R2, R1). Although such increase in power dissipation can provide advantages during an active mode of operation of the amplifier (reduced RF coupling due to higher impedance), no advantages are provided during a standby mode of operation. As the amplifier (200) is not amplifying in the standby mode, no RF signal is present in the transistor stack (M4, M3, M2, M1) and therefore no coupling effect of the RF signal to the biasing circuit exists. However, biasing voltages to the gates of the transistors (M4, M3, M2) must be maintained during the standby mode of operation of the amplifier (200) so as to maintain operation of the transistors (M4, M3, M2, M1) of the stack within their tolerable voltage ranges. It follows that the teachings according to the present disclosure provide methods and apparatus to reduce RF coupling effects to the biasing circuit during an active mode of operation of a stacked transistor amplifier, and reduce power dissipation in the biasing circuit during a standby mode of operation of the stacked transistor amplifier, while maintaining same gate biasing voltages to the gates of the stacked transistors (e.g., M4, M3, M2) in both modes of operation. As can be seen in FIG. 2, an optional diode connected transistor M10 is added to the resistive ladder network (R4, R3, R3, R1) which can allow voltages at the nodes ($V_{B4}$, $V_{B3}$, $V_{B2}$) to track process related variations that may affect characteristics of the transistors (M4, M3, M2, M1). By choosing the diode connected transistor M10 to have a same characteristics as for the transistors (M4, M3, M2, M1), process related variations can equally affect current versus voltage response of the transistors (M10, M4, M3, M2, M1) and therefore allow the voltages at the nodes ($V_{B4}$, $V_{B3}$, $V_{B2}$) to track such process variations.

Figure 3:
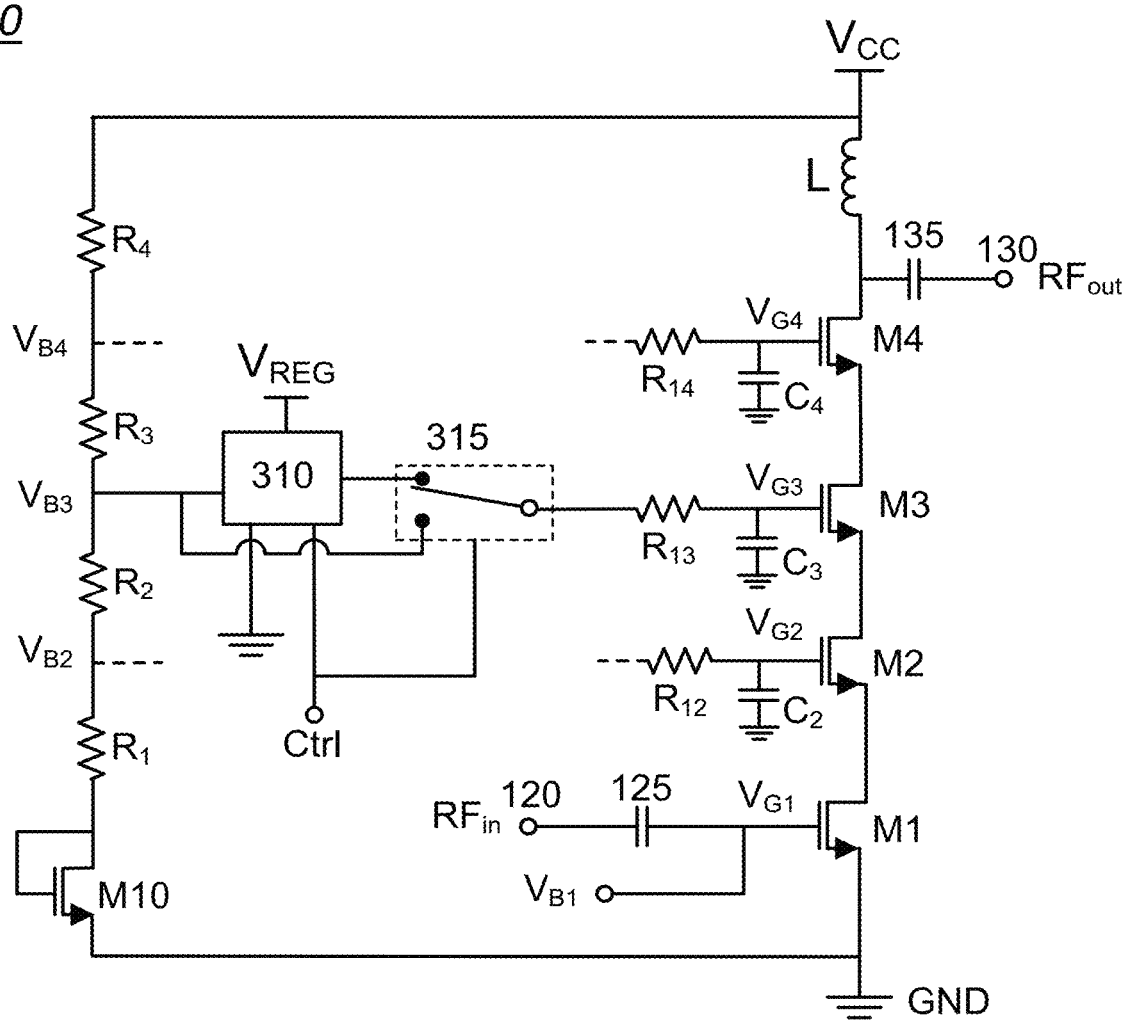
FIG. 3 shows an embodiment according to the present disclosure of a switchable biasing circuit that can switch an impedance presented to the gates of the transistors while maintaining proper biasing of the transistors.

FIG. 3 shows a simplified schematic of a stacked cascode amplifier (300), similar to the amplifier (200) depicted in FIG. 2, which comprises a switchable biasing circuit (e.g., R4, R3, R2, R1, 310, 315) according to an embodiment of the present disclosure that can switch an impedance presented to the gates of the stacked transistors (M4, M3, M2) while maintaining proper biasing of the transistors. It should be noted that for clarity reasons, only one switchable element (310, 315 associated to the gate of the transistor M3) of the switchable biasing circuit of the present disclosure is depicted in FIG. 3, as similar switchable elements (310, 315) can be provided for biasing of the transistors (M4, M2).

The switchable impedance element (310, 315) of FIG. 3 comprises an impedance conversion unit (310) that is coupled, at an input node of the impedance conversion unit (310), to a node, $V_{B3}$, of the resistive ladder network (R4, R3, R2, R1), and optionally, the diode connected transistor M10. The impedance conversion unit (310) is coupled, at an output node of the impedance conversion unit (310), to a first switching node of a switch (315). A second switching node of the switch (315) is coupled to the node $V_{B3}$. A common node of the switch (315) is coupled to the gate of the transistor M3 via the resistor R13. A control signal, Ctrl, selectively controls a conduction path coupled to the common node of the switch (315), between a conduction path including the output node of the impedance conversion unit (310) and a conduction path excluding such output node. The same control signal, Ctrl, can be used to enable and disable operation of the impedance conversion unit (310). According to one exemplary embodiment, when disabled, no current is drained through the impedance conversion unit (310).

In the exemplary configuration depicted in FIG. 3, the position of the switch (315) is such that the common node of the switch (315) couples the gate of the transistor M3 to the output node of the impedance conversion unit (310), therefore presenting a voltage and an impedance at the output node of the impedance conversion unit (310), to the gate of the transistor M3. In an alternate position (not shown) of the switch (315), the common node of the switch (315) couples the gate of the transistor M3 to node $V_{B3}$ of the resistive ladder network (R4, R3, R2, R1), therefore presenting a voltage and an impedance at node $V_{B3}$ to the gate of the transistor M3.

According to an embodiment of the present disclosure, the impedance conversion unit (310) is configured to convert an impedance of the resistive ladder network (R4, R3, R2, R1) presented at the node $V_{B3}$ to a lower impedance at the output node of the impedance conversion unit (310), while maintaining a voltage level at said output node that is substantially the same as the voltage at the node $V_{B3}$ (which is connected to the input node of 310). Accordingly, the voltage presented to the gate of the transistor M3 at the common node of the switch (315) remains constant irrespective of the position of the switch (315), while the impedance presented to the gate of the transistor M3 at the common node of the switch (315) is selectively configured to be either the impedance at node $V_{B3}$, or the lower impedance at the output node of the impedance conversion unit (310).

Based on the above, it follows that the switchable biasing circuit (R4, R3, R2, R1, 310, 315) according to the present disclosure depicted in FIG. 3, allows maintaining a same biasing voltage to the gate of the transistor M3 while selectively coupling/decoupling an impedance of the resistive ladder network (R4, R3, R2, R1) to/from said gate.

With further reference to the amplifier (300) of FIG. 3, according to an embodiment of the present disclosure, the control signal, Ctrl, can be a digital control signal to control operation of the amplifier (300) in one of the active mode and of the standby mode. Accordingly, for operation of the amplifier (300) in the active mode of operation, the control signal, Ctrl, can control the position of the switch (315) to connect the output node of the impedance conversion unit (310) to the resistor R13, thereby presenting a low impedance and a desired bias voltage to the gate of the transistor M3. Alternatively, for operation of the amplifier (300) in the standby mode of operation, the control signal, Ctrl, can control the position of the switch (315) to connect the node $V_{B3}$ to the resistor R13, thereby presenting a higher impedance and the same desired bias voltage to the gate of the transistor M3. A person skilled in the art would know of many ways to control the cascode stack to operate in one of the active mode and of the standby mode. According to one exemplary embodiment, the control signal, Ctrl, may control a biasing circuit that generates a biasing voltage for the gate of the input transistor M1 at the node $V_{B1}$ to turn OFF the input transistor for operation in the standby mode. As noted above, the referenced Published US Application No. 2015/0270806 whose disclosure is incorporated herein by reference in its entirety describes various biasing methods and apparatus for the input transistor M1.

Since during the active mode of operation of the amplifier (300) of FIG. 3 the gate of the transistor is isolated from the node $V_{B3}$, the impedance at node $V_{B3}$ may not affect coupling of an RF signal at the gate of the transistor M3. In turn this allows choosing the resistance values of the resistors of the resistive ladder network (R4, R3, R2, R1) to be high enough so as to reduce a standby current (power dissipation during the standby mode) in the resistors while providing a desired gate biasing voltage for the transistor M3 (through voltage at the node $V_{B3}$). It follows that the switchable biasing circuit (R4, R3, R2, R1, 310, 315) of the stacked amplifier (300) depicted in FIG. 3 allows maintaining of a desired biasing voltage at the gate of the transistor M3 during both operation modes of the amplifier (300) while presenting a low impedance to said gate for reduced RF coupling effects to the biasing voltages during the active mode of operation, and reducing standby power dissipation in the resistive ladder network. Same effects can be produced via similar switching impedance elements (310, 315) provided for biasing of the gates of the transistors (M2, M4), such as depicted, for example, in FIG. 7 later described.

With further reference to FIG. 3, the impedance conversion unit (310) is configured to provide a high isolation between its input node, connected to node $V_{B3}$, and its output node, connected to the switch (315). Furthermore, as described above, the impedance conversion unit (310) is configured to present a low impedance at its output node, and output a voltage at its output node which is equal to the voltage at its input node ($V_{B3}$). A person skilled in the art would know of many ways to implement such circuit. According to one exemplary embodiment, a source-follower can be used as the impedance conversion unit (310), as shown in FIG. 4A and FIG. 4B.

Figure 4A:
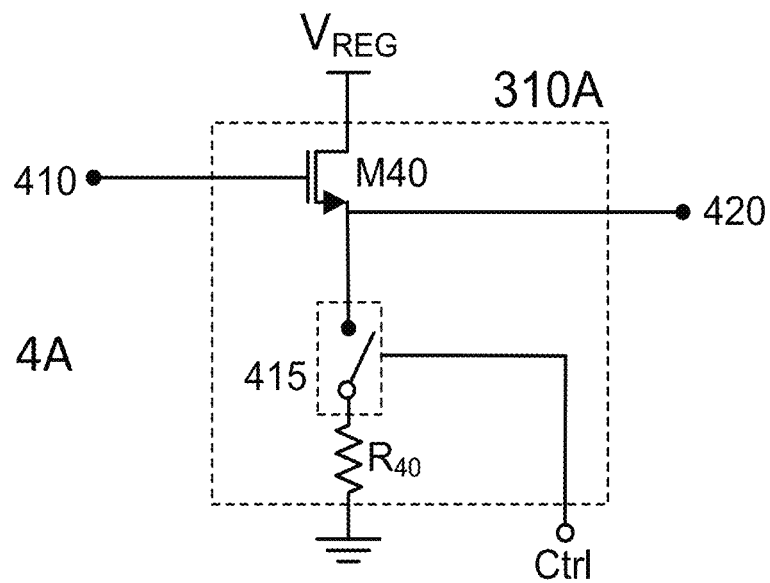
FIG. 4A and FIG. 4B show exemplary embodiments of source-follower transistor circuits used in the switchable biasing circuits of the present disclosure.
Figure 4B:
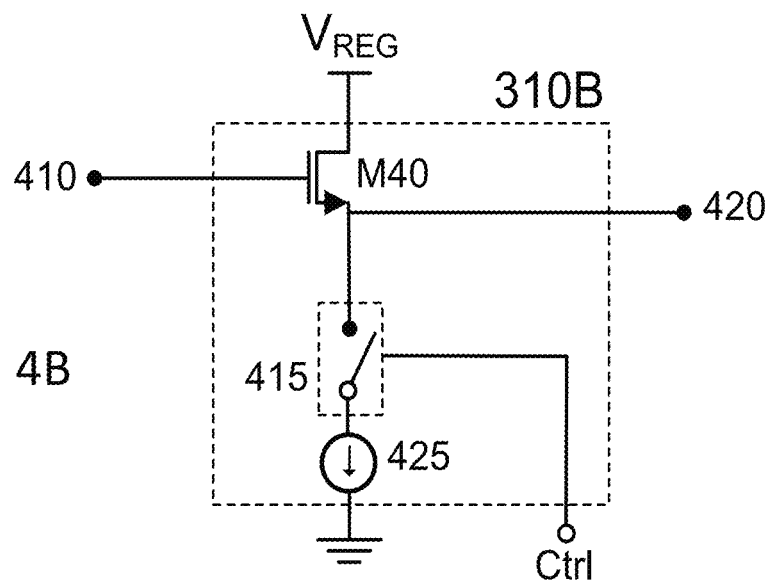

With further reference to the impedance conversion units (310A) and (310B) of FIG. 4A and FIG. 4B, a source-follower circuit can be used to provide functionality of a buffer circuit that buffers nodes ($V_{B4}$, $V_{B3}$, $V_{B2}$) connected at the input node (410), while converting their impedances at the output node (420). Transistor M40 is configured as a source-follower, with a drain of the transistor M40 connected to a supply voltage, $V_{REG}$, and the source of the transistor M40 connected to a current sinking element (R40, 425) by way of a switch (415). In the exemplary embodiment of FIG. 4A, the current sinking element is a resistor (R40) whose size is chosen for a desired current through the transistor M40 which determines an output impedance of the transistor M40, and therefore an output impedance at the output node (420). Furthermore, according to an exemplary embodiment, the transistor M40 can have a low threshold voltage, substantially equal to 0 V, so as gate to source voltage drop of the transistor M40 is substantially equal to 0 V (i.e., $V_{GS}=0$ V). During the active mode of operation of the impedance conversion unit (310A) of FIG. 4A, the switch (415) is closed to allow flow of current through the resistor R40, and during the standby mode of operation the switch (415) is opened to stop current flow, and therefore power consumption through the impedance conversion unit (310A). Operation of the exemplary impedance conversion unit (310B) is similar to the operation of the element (310A) with the difference that a current source (425) is used in lieu of the resistor R40 as a means to sink current through the transistor M40. Due to its inherent smaller physical size as compared to a resistor (e.g., R40), the current source can allow for an overall reduction in the size of the circuit (310B) when compared to the circuit (310A).

With further reference to the impedance conversion units (310A) and (310B) of FIG. 4A and FIG. 4B, the supply voltage, $V_{REG}$, can be a regulated voltage independent from a voltage level of the supply voltage $V_{CC}$, or alternatively can be a function of the supply voltage $V_{CC}$, including $V_{CC}$. A person skilled in the art would realize that a voltage level of $V_{REG}$ must comply to a voltage compliance of the transistor M40 so as to operate the transistor within its tolerable voltage range. As voltages at the nodes ($V_{B4}$, $V_{B3}$, $V_{B2}$) of the resistive ladder network (R4, R3, R2, R1) can be different, depending on a node ($V_{B4}$, $V_{B3}$, $V_{B2}$) coupled to the input node (410) of the impedance conversion unit (310A, 310B), a corresponding level of the supply voltage $V_{REG}$ may be different, as shown in FIG. 7, later described.

Figure 5:
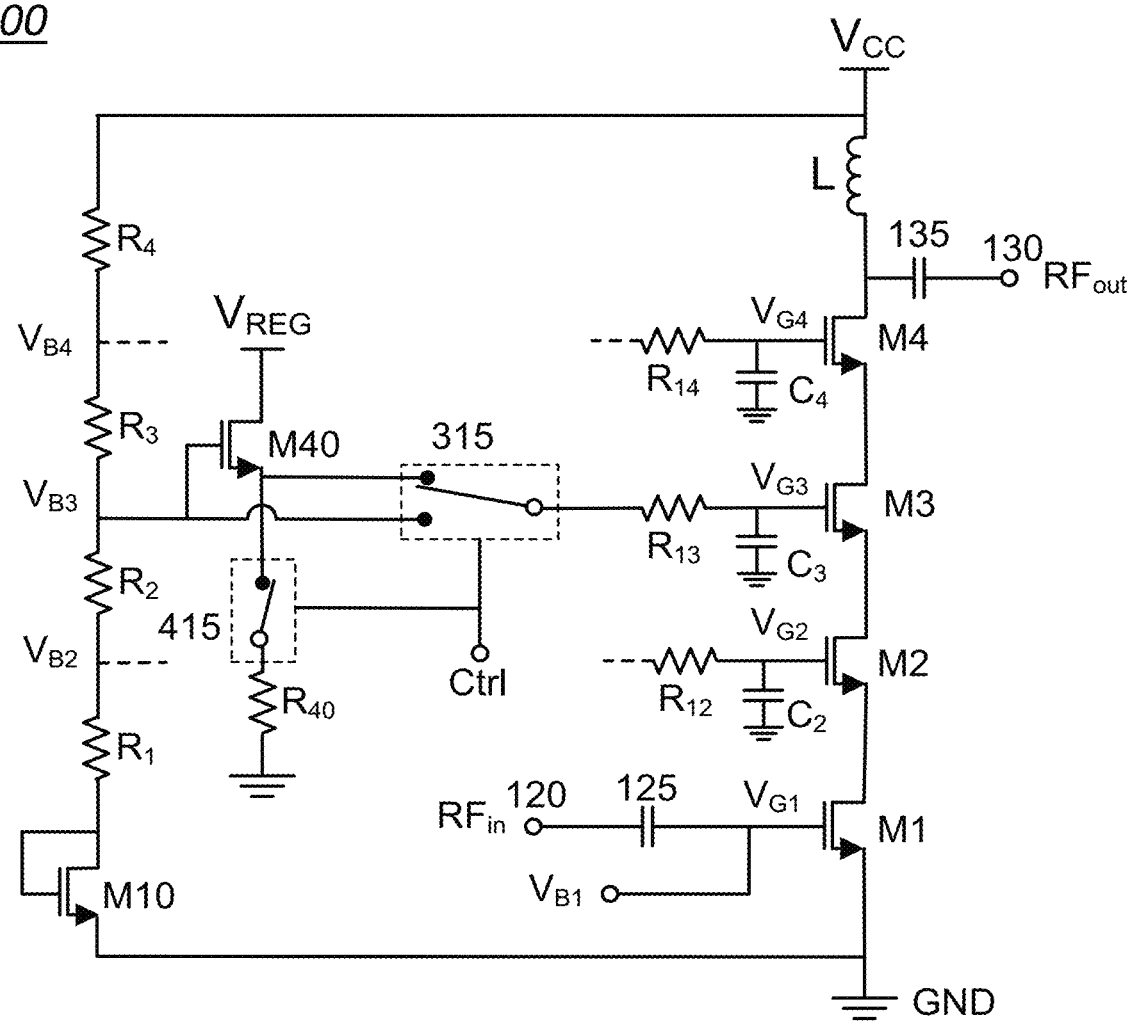
FIG. 5 shows an exemplary embodiment according to the present disclosure of the switchable biasing circuit of FIG. 3 using the exemplary source-follower transistor circuit of FIG. 4A.

FIG. 5 shows a simplified schematic of a stacked cascode amplifier (500) which uses the impedance conversion unit (310A) of FIG. 4A. A person skilled in the art would realize that biasing of the amplifier (500) is according to the switchable biasing discussed with respect to the amplifier (300) of FIG. 3, where the impedance conversion unit (310) of FIG. 3 is replaced by the source-follower configuration (310A) discussed with respect to FIG. 4A. As noted above, for clarity reasons, only one such element (310A) is shown in FIG. 5, as similar elements (310A), that may be powered by different supply voltages, $V_{REG}$, may also be coupled between each of the ($V_{B4}$, $V_{B3}$, $V_{B2}$) nodes of the resistive ladder network (R4, R3, R2, R1) and corresponding gate resistors (R14, R13, R12). As previously noted, the four-stage cascode configuration of the FIG. 5 is just an exemplary embodiment of the present disclosure and should not be conceived as limiting the scope of what the applicant considers to be the invention, as the present teachings equally apply to configurations having different number of stages (e.g., 2, 3, 4, 5, and higher).

Figure 6:
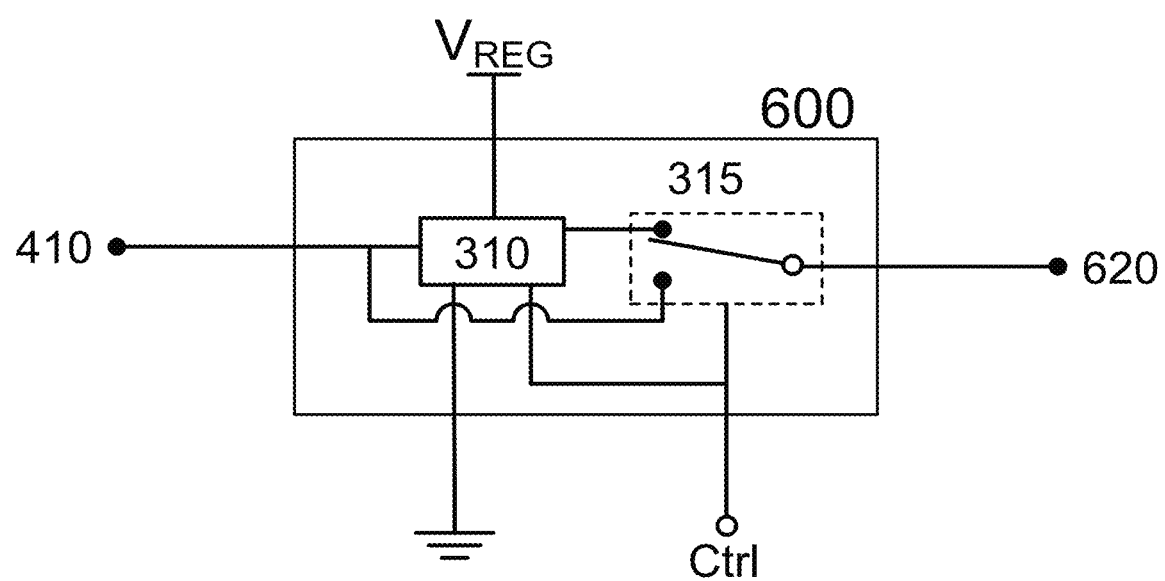
FIG. 6 shows an impedance control element that when coupled to the prior art embodiments depicted in FIG. 1 and FIG. 2 provides functionality of the switchable biasing circuit of the present disclosure depicted in FIG. 3.

With further reference to the switchable biasing circuit (R4, R3, R2, R1, 310, 315) of the present disclosure depicted in FIG. 3, the impedance conversion unit (310) coupled to the switch (315) can be considered as an impedance control element (600) as depicted in FIG. 6. According to the above description, the impedance control element (600) that has the functionality of coupling a voltage at its input node (410) to its output node (620) while selectively changing the impedance at its output node under control of the control signal, Ctrl. In other words, during a first mode of operation (e.g., standby mode), a voltage at the output node (620) equals a voltage at the input node (410), and an impedance at the output node (620) equals the impedance at the input node (410). During a second mode of operation (e.g., active mode), a voltage at the output node (620) equals the voltage at the input node (410), and the impedance at the output node (620) is lower than the impedance at the input node (410). Furthermore, during the first mode of operation, no current is drained by the impedance control element (600), and during the second mode of operation, an isolation between the output node (620) and the input node (410) is high. Given such functionality, it is well within the capabilities of a person skilled in the art to design circuits for usage in the switchable biasing circuit of the present disclosure. Such circuits can use, for example, operational amplifiers or discrete transistors to provide buffering of the voltage at the input node (410) while presenting a different impedance at the output node (620). In other words, the impedance conversion unit (310) of the impedance control element (600) may include anyone or a combination of transistors and operational amplifiers (with or without feedback).

Figure 7:
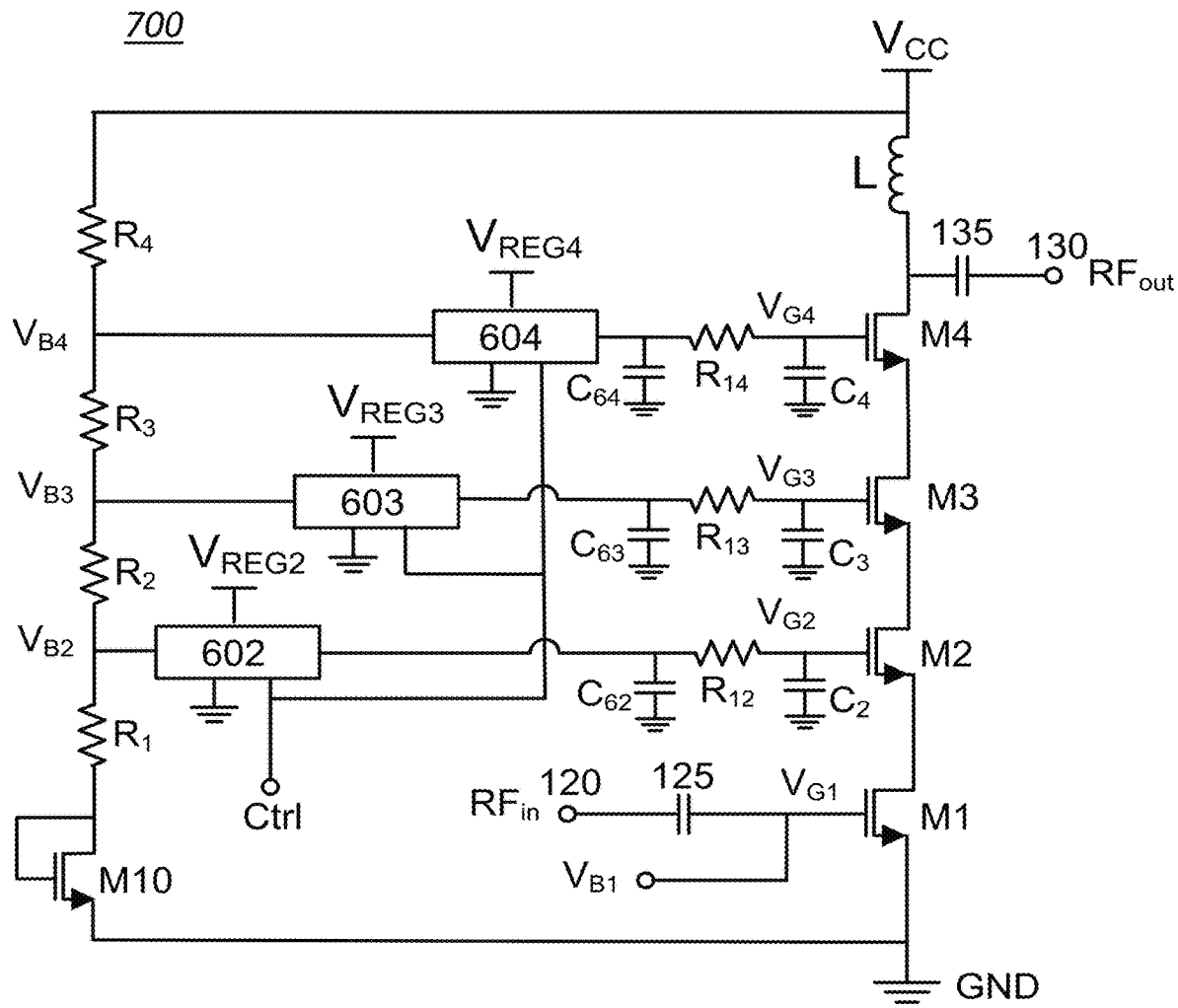
FIG. 7 shows a switchable biasing circuit according to the present disclosure, where a plurality of impedance control elements, similar to the one depicted in FIG. 6, powered by different voltages, are used to each provide a biasing voltage to a different transistor of the stack.

FIG. 7 shows a simplified schematic of a stacked cascode amplifier (700) which comprises a switchable biasing circuit (R4, R3, R2, R1, 602, 603, 604) according to the present teachings. Each of the elements (602, 603, 604) is according to the impedance control element (600) described in relation to FIG. 6. As previously described, each of the impedance control elements (602, 603, 604) may be powered by a different (or same) supply voltage ($V_{REG2}$, $V_{REG3}$, $V_{REG4}$) to allow voltage compliance of constituent electronic elements (e.g., transistors, operational amplifiers). As voltages at the nodes ($V_{B4}$, $V_{B3}$, $V_{B2}$) can follow the expression $V_{B4} > V_{B3} > V_{B2}$, according to one exemplary embodiment of the present disclosure the supply voltages ($V_{REG2}$, $V_{REG3}$, $V_{REG4}$) can also follow a similar expression, where $V_{REG4} > V_{REG3} > V_{REG2}$. Operation of the stacked cascode amplifier (700) of FIG. 7 is as described with respect to the operation of the amplifier (300) of FIG. 3. According to an exemplary embodiment, the impedance control elements (602, 603, 604) present a same impedance value to the gates of the transistors (M4, M3, M2) during the active mode of operation of the amplifier (700). Other exemplary embodiments where the impedance control elements (602, 603, 604) present different impedance values to the gates of the transistors (M4, M3, M2) during the active mode of operation of the amplifier (700) may be possible.

With further reference to the amplifier (700) depicted in FIG. 7, optional capacitors ($C_{64}$, $C_{63}$, $C_{62}$) can be used to further isolate the biasing circuit from coupled RF signals at the gates ($V_{G4}$, $V_{G3}$, $V_{G2}$) of the transistors (M4, M3, M2). The combination of such capacitors with the series connected resistors (R14, R13, R12) can create a low pass filter whose cutoff frequency is chosen according to a frequency of operation of the RF signal amplified by the amplifier (700). Although not shown in the other figures of the present disclosure, similar capacitors can be used in any of the presented embodiments.

The switchable biasing circuits according to the present disclosure discussed above can use an impedance conversion unit (e.g., 310 of FIG. 3, FIG. 4A, FIG. 4B, FIG. 6) which comprises active components, such as a transistor M40, as depicted in FIG. 4A, FIG. 4B and FIG. 5, or other active components, such an operational amplifier, as discussed above. An alternate switchable biasing circuit according to a further embodiment can use mainly passive components, such as resistors, for a simpler biasing configuration, as depicted in FIG. 8, while providing the same principles of operation as provided by the above discussed configurations, that is, to reduce RF coupling effects to the biasing circuit during an active mode of operation of the stacked transistor amplifier, and reduce power dissipation in the biasing circuit during a standby mode of operation of the stacked transistor amplifier, while maintaining same gate biasing voltages to the gates of the stacked transistors (e.g., M4, M3, M2) in both modes of operation.

Figure 8:
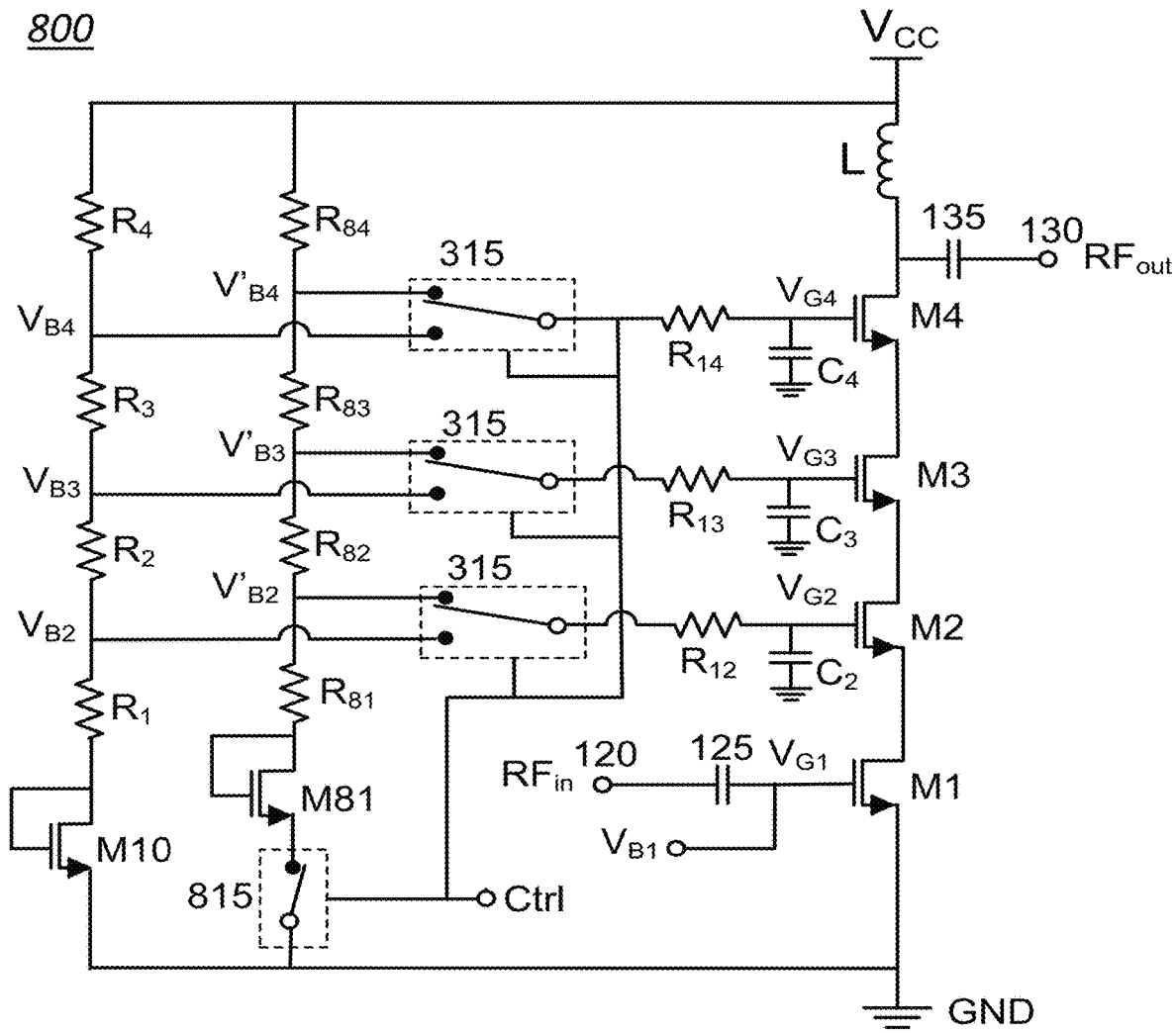
FIG. 8 shows a switchable biasing circuit according to the present disclosure, where two separate resistive ladder networks are used to provide different impedances presented to the gates of the transistors of the stack while maintaining proper biasing of the transistors.

With further reference to the amplifier (800) of FIG. 8, two separate resistive ladder networks (R4, R3, R2, R1) and (R84, R83, R82, R81) are used to each provide a same biasing voltage to the gates of the transistors (M4, M3, M2, M1) by way of node voltages ($V_{B4}$, $V_{B3}$, $V_{B2}$) and ($V'_{B4}$, $V'_{B3}$, $V'_{B2}$). As discussed above, each ladder can have an optional diode connected transistor (e.g. M10, M81) to allow voltages at the nodes of the ladders to track process related variations of the stacked transistors (M4, M3, M2, M1). An optional switch (815) can be used to control a current conduction path across the resistive ladder networks.

The resistive ladder network (R4, R3, R2, R1) of FIG. 8 has been described with respect to the previous figures (e.g. FIG. 3) and can include resistance values high enough to reduce a standby current through the ladder. Accordingly, a switch to completely remove a current path through the ladder (as per switch 815) during the active mode of operation may not be necessary as very little current is expected to conduct through the ladder. In some exemplary embodiments, resistance values of the resistors (R4, R3, R2, R1) can be high enough to allow conduction of a current as small as 3 µA through the ladder. As described above, during the standby mode of operation of the amplifier (800), biasing voltages to the gates of the transistors (M4, M3, M2, M1) are provides by the nodes ($V_{B4}$, $V_{B3}$, $V_{B2}$) of the resistive ladder network (R4, R3, R2, R1), where each such nodes presents a higher impedance to the gates of said transistors. As discussed above, selection of such nodes is provided by the switches (315).

The resistive ladder network (R84, R83, R82, R81) of FIG. 8 divides a voltage (e.g. $V_{CC}$ as shown in FIG. 8) across the ladder to generate voltages at corresponding nodes ($V'_{B4}$, $V'_{B3}$, $V'_{B2}$) substantially equal to the voltages at the nodes ($V_{B4}$, $V_{B3}$, $V_{B2}$) with the difference that each of the nodes ($V'_{B4}$, $V'_{B3}$, $V'_{B2}$) presents an impedance to a gate of a corresponding transistor (M4, M3, M2, M1) which is substantially lower than the impedance presented by a corresponding node ($V_{B4}$, $V_{B3}$, $V_{B2}$) of the resistive ladder network (R4, R3, R2, R1). As described above, this allows reducing coupling effects of the RF signal conducted through the transistors (M4, M3, M2, M1) with respect to the biasing voltages at the nodes ($V'_{B4}$, $V'_{B3}$, $V'_{B2}$). The lower impedance presented by the nodes ($V'_{B4}$, $V'_{B3}$, $V'_{B2}$) is provided by choosing smaller resistance values of the resistors (R84, R83, R82, R81), which is turn allows for a substantially larger current to flow through the resistive ladder network (R84, R83, R82, R81). Therefore, during the standby mode of operation of the amplifier (800) of FIG. 8, the switch (815) removes a conduction path to the current in the ladder. In some exemplary embodiments, resistance values of the resistors (R84, R83, R82, R81) can be low enough to allow conduction of a current as large as 0.8 mA through the ladder.

Figure 9A:
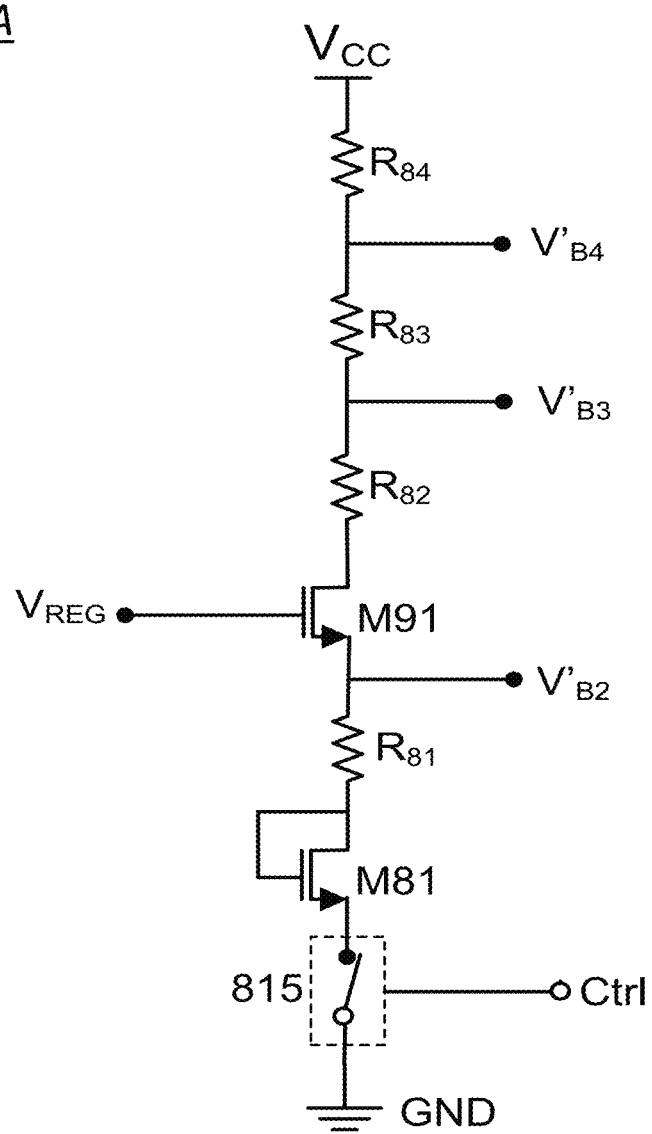
FIG. 9A shows a resistive ladder network used in the switchable biasing circuit of FIG. 8, where a series connected transistor is inserted between two resistors of the ladder.

FIG. 9A shows an alternative embodiment of the resistive ladder network (R84, R83, R82, R81) of FIG. 8, where an additional transistor, M91, in series connection between the resistors R82 and R81, can be used to force a desired voltage at a node $V'_{B2}$ of the resistive ladder network.

Figure 9B:
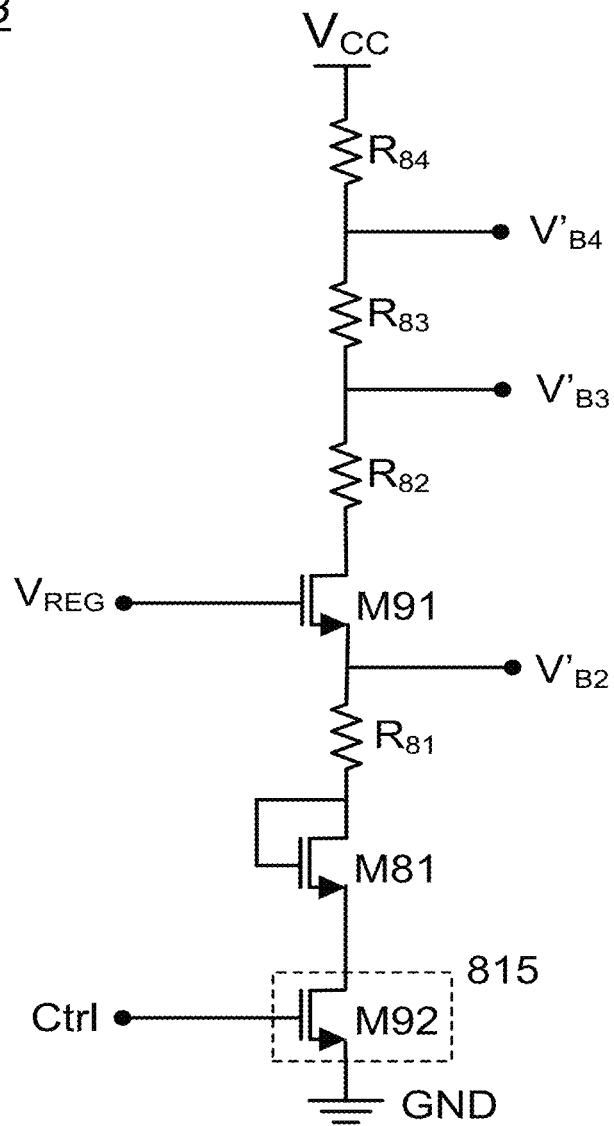
FIG. 9B shows an exemplary embodiment of the switch (815) used in the resistive ladder network of FIG. 9A, where a FET transistor M92 is used as the switch.

FIG. 9B shows the same resistive ladder network according to FIG. 9A where according to an exemplary embodiment, the switch (815) is implemented via a FET transistor M92. A person skilled in the art would know of many different ways to implement the switch (815) as the exemplary embodiment depicted in FIG. 9B should not be considered as limiting the scope of what the applicant considers to be the invention.

The above description mainly discusses biasing of the transistors of the stack except the input transistor M1. A person skilled in the art would know that such biasing of the input transistor can determine a biasing current through the transistors (M4, M3, M2, M1) and therefore can dictate a gain of the amplifier using the stacked transistors (M4, M3, M2, M1). FIG. 10A depicts a simplified schematic of a prior art stacked cascode amplifier arrangement (1000A) where a replica circuit (1010) is used in the generation of the gate biasing voltage $V_{G1}$ of the input transistor M1. Biasing circuits (not shown in FIG. 10A) that generate gate biasing voltages to the upper transistors (M4, M3, M2) of the stack can be according to any known biasing circuit in the art, including the biasing circuits described in the above referenced U.S. Pat. No. 7,248,120, Published US Application No. 2015/0270806 A1, and Published US Application No. US 2014/0184336 A1, whose disclosures are incorporated herein by reference in their entirety, or according to the biasing circuits discussed above with reference to, for example, FIG. 3, FIG. 5, FIG. 7 and FIG. 8.

The replica stack circuit (1010) of FIG. 10A can comprise a stack of transistors (M'4, M'3, M'2, M'1) where each of the transistors (M'4, M'3, M'2, M'1) is a reduced size version (e.g. by a factor N, where N can be, for example, from 100 to 1000) of a respective transistor (M4, M3, M2, M1) used in the amplification stage of the stacked cascode amplifier (1000A). By biasing an input transistor M'1 of the replica circuit (1010) according to a same biasing voltage used in the biasing of an input transistor M1 of the main amplification stage, and regulating the gate bias voltage provided to transistor M'1 for conduction of a reference current $I_{REF}$ through the replica stack (1010), a multiple of the reference current, $N \times I_{REF}$, can be conducted through the stacked transistors if the input transistor M1 is provided with the same regulated gate bias voltage. This is shown in FIG. 10A, where the input transistor M'1 of the replica stack (1010) is provided a same gate biasing voltage $V_{G1}$ as provided to the input transistor M1 of the amplification stage, and where the voltage $V_{G1}$ is regulated via a closed loop system, comprising a $V_{G1}$ bias control module (1020), so as to conduct a current $I_{REF}$, generated by a current source (1030), through the replica stack circuit (1010). Although in the exemplary prior art embodiment depicted in FIG. 10A, the $V_{G1}$ bias control module (1020) is shown to sense a voltage at the drain of the transistor M'4 of the replica stack (1010), other embodiments where other voltages in the replica stack (1010) are sensed are possible. Such voltages can be used as part of a closed loop system that regulate the voltage $V_{G1}$ so as to conduct the current $I_{REF}$ through the replica stack (1010). Accordingly, a current equal to $N \times I_{REF}$ is conducted through the transistors (M4, M3, M2, M1) of the amplification stage, where N is a size factor between a size of the transistors in the amplification stage and the size of the transistors in the replica circuit. More details on circuital implementation examples of a biasing circuit similar to the one depicted in the FIG. 10A can be found, for example, in the above referenced U.S. Pat. No. 7,248,120, Published US Application No. 2015/0270806 A1, whose disclosure is incorporated herein by reference in its entirety. Based on such description, it would be clear to a person skilled in the art that a corresponding current source (1030) and $V_{G1}$ bias control module (1010) can be implemented in a variety of ways, including usage of auxiliary circuitries around operational amplifiers and/or current mirrors.

With further reference to FIG. 10A, it should be noted that although such figure shows a same number of stacked transistor in the replica circuit as in the amplification stage, other configurations, such as the exemplary configuration depicted in FIG. 10B, where a number of stacked transistors (M'1, M'2, M'3) used in the replica circuit are different from a number of stacked transistors (M1, M2, M3, M4) used in the amplification stage are also possible. Such configurations can similarly generate a reference current, $I_{REF}$, through the replica circuit by regulating the voltage $V_{G1}$ that is common to both stacks. Accordingly, and as described above, a current $N' \times I_{REF}$ is conducted through the transistors (M4, M3, M2, M1) of the amplification stage, where N' is a size factor between a size of the transistors in the amplification stage and the size of the transistors in the replica circuit. Furthermore, as shown in in the exemplary case depicted in FIG. 10C, a supply voltage to the replica circuit may be the same supply voltage, $V_{CC}$, provided to the amplification stage. With reference to FIGS. 10A, 10B and 10C, gate biasing voltages ($V'_{G4}$, $V'_{G3}$, $V'_{G2}$) or ($V'_{Gn}$, . . . , $V'_{Gk}$) to the transistors of the replica circuit (except the input transistor), may be same or different than the gate biasing voltages ($V_{G4}$, $V_{G3}$, $V_{G2}$) provided to the transistors of the amplification stage, as such biasing voltages may depend on a height of each of the stacks and a supply voltage (e.g., $V_{CC}$, $V_{DD}$) to the stack. Accordingly, the exemplary embodiments described in the present application using a same number of stacked transistors in the replica circuit and the amplification stage should not be considered as limiting the scope of the teachings according to the present disclosure.

With reference to the multi-stage cascode amplifier arrangement (1000A) depicted in FIG. 10A, it may be desirable to operate such amplifier in an active mode, for amplification (and transmitting) of an $RF_{in}$ signal at its input terminal (120), and in a standby mode, where essentially no current is conducted through the transistor stack (M4, M3, M2, M1). As discussed above with reference to the other figures, voltage compliance of the transistors (M4, M3, M2, M1) must be maintained for safe operation of the transistors during both modes of operation, and the above teachings according to the present disclosure, as related to, for example, FIG. 3, FIG. 5, FIG. 7 and FIG. 8, describe methods and devices to reduce standby mode power consumption in the biasing circuit used to generate gate biasing voltages for the transistors (M4, M3, M2), while presenting low impedance biasing nodes to the gates of the transistors (M4, M3, M2) during the active mode, so as to reduce coupling of the RF signal to the biasing circuit. However, during either modes of operation, the replica circuit (1010) is not coupled to the RF signal, and therefore added flexibility in the design of the biasing circuit for the replica circuit (1010) can be obtained.

According to an exemplary prior art embodiment, during the standby mode of operation, the current source (1030) of FIG. 10A and corresponding auxiliary circuitry are disabled so as to reduce consumed power (supply power removed from the circuitry), while the $V_{G1}$ bias control module (1020) grounds the gates of the transistors M1 and M'1, thereby removing current conduction through both transistor stacks (M4, M3, M2, M1) and (M'4, M'3, M'2, M'1). Gate biasing voltages ($V'_{G4}$, $V'_{G3}$, $V'_{G2}$) can also be removed, or set to 0 V, during the standby mode of operation. It should be noted that operation in one of the standby and active mode can be controlled via a control signal, Ctrl, as shown in FIG. 10A, which can be generated within a controller unit, such as, for example, a transceiver unit, which is aware of an overall communication protocol to which amplifier arrangement (1000A) contributes.

With further reference to the amplifier arrangement (1000A) of FIG. 10A, disabling the current source (1030) and optionally grounding (e.g. set to 0 V, or to a reference potential) the gate of the transistor M'1 (during the standby mode of operation) can in turn cause the drain of the transistor M'4, as well as of transistors M'3, M'2 and M'1, to collapse to ground, while the drain of the output transistor M4 remains at $V_{CC}$ and the drains of M3, M2, M1 see voltages corresponding to a division of the voltage at $V_{CC}$ across the transistors (as described above by way of the biasing of the transistors M4, M3 and M2). A person skilled in the art would realize that if bodies of the transistors (M4, M3, M2, M1) and (M'4, M'3, M'2, M'1) are floating (e.g., floating bodies), then potentials of the body of a transistor stand at a potential between a potential of the drain and a potential of the source of the transistor. Therefore, in the case of the replica circuit (1010) and the transistor stack (M4, M3, M2, M1) of the amplification stage of FIG. 10A, bodies of the corresponding transistors when operating in the standby mode can be at very different potentials. As known to a person skilled in the art, body effect of a transistor, which is a function of a body potential of the transistor, can influence a response of the transistor, in particular a current versus voltage characteristics. Furthermore, the body potential of a transistor has a time constant that prevents a quick change of the body potential as a result, for example, of a changing drain/source potential of the transistor. It follows that, when the amplifier arrangement (1000A) switches operation from the standby mode to the active mode, the body potentials of the transistors (M4, M3, M2, M1) are at normal operating levels (since transistor biasing does not change), while the body potentials of the transistors (M'4, M'3, M'2, M'1) are at different operating levels and start charging up, relatively slowly, to the normal operating levels as a consequence of the applied $V_{DD}$. During a charging up time of the body potentials of the transistors (M'4, M'3, M'2, M'1) according to the prior art embodiment depicted in FIG. 10A, the replica circuit (1010) cannot be considered operating as a "replica" circuit, since a gate biasing voltage applied to the transistor M'1 for conduction of the reference current $I_{REF}$ changes and only stabilizes once the body potentials settle. Therefore, during the charging up time of the body potentials of the transistors (M'4, M'3, M'2, M'1) of the replica circuit (1010), a varying biasing current (e.g., DC current) conducted in the transistor stack (M4, M3, M2, M1) is not according to a desired current (e.g. $N \times I_{REF}$), which can result in a non-ideal output response of the amplifier arrangement (1000A). Such non-ideal output response can in turn result in corruption in data transmitted by a communication system that uses the amplifier arrangement (1000A). For example, a transceiver may send a control signal, Crtl, to the amplifier arrangement (1000A) to switch into the active mode of operation and start sending the $RF_{in}$ to be amplified by the amplifier arrangement (1000A) within a fraction of a microsecond of the control signal, Ctrl. In response to the control signal, Ctrl, the amplifier arrangement (1000A) may activate the current source (1030) and provide biasing voltages to the replica circuit (1010) within a fraction of a microsecond. However, a settling time of the body potentials of the transistors (M'4, M'3, M'2, M'1) may be in the order of 100's of microseconds, during which time the amplifier arrangement (1000A) operates in a sub-optimal mode, as a result of its non-ideal output response, and possibly corrupt data included at its $RF_{out}$ signal. A similar effect with respect to settling of the body potentials can also be expected with respect to settling of the gate voltages of the transistors (M'4, M'3, M'2, M'1) during a (post switching) transition time from the standby mode to the active mode of operation, as such gate voltages are charged through the drain-to-gate capacitances of such transistors, and can therefore further impact a (transient) response of the replica circuit during the post switching transition time.

Figure 11:
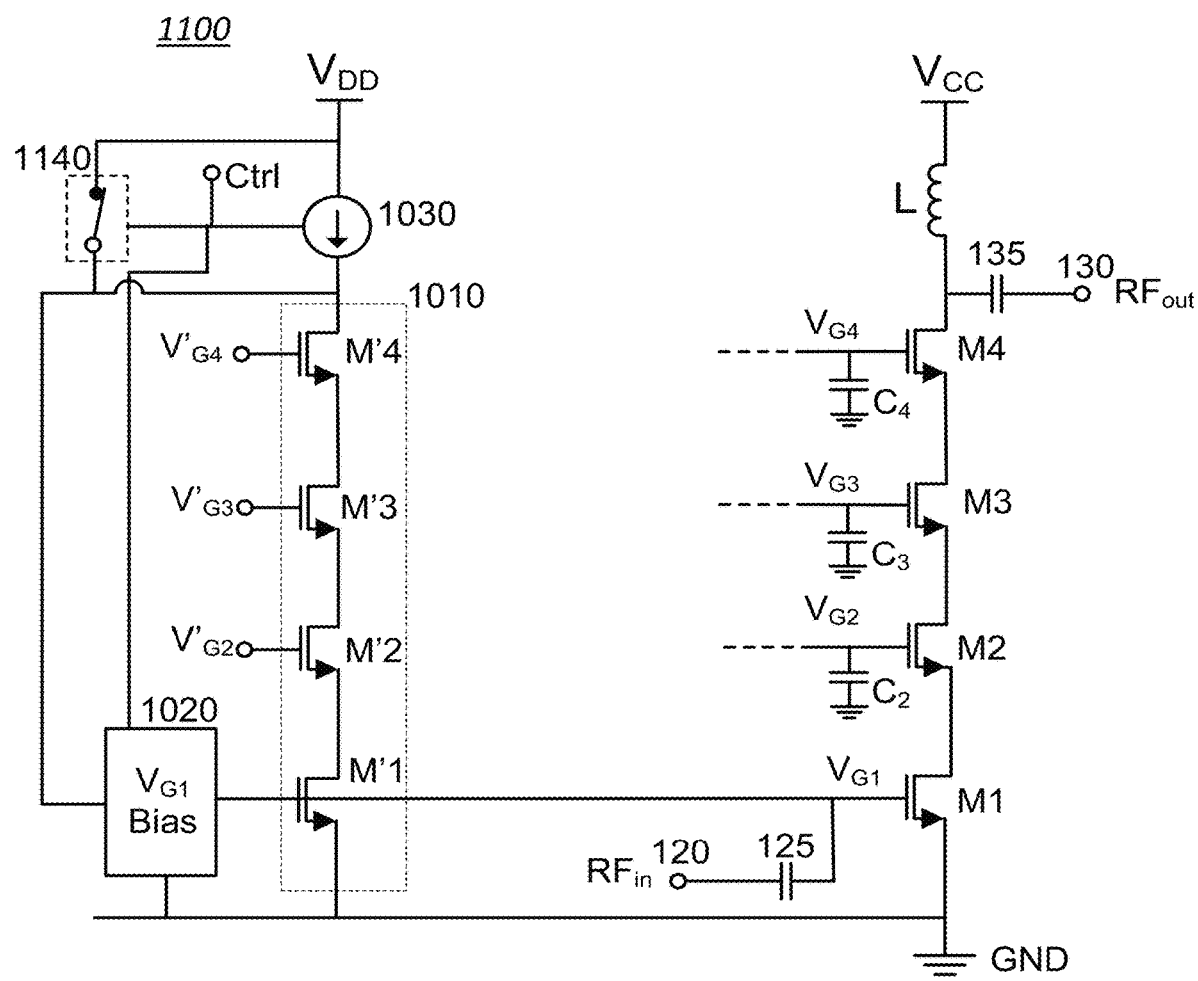
FIG. 11 shows a simplified biasing circuit according to an embodiment of the present disclosure, where a voltage across the stacked transistors is maintained during a standby mode of operation to allow fast recovery of the biasing voltage to the gate of the input transistor when switching to the active mode.

A person skilled in the art may consider using body tied transistors as the transistors (M4, M3, M2, M1) and (M'4, M'3, M'2, M'1) in order to reduce, or remove, the above discussed body effects with respect to the prior art activation and deactivation of the current source (1030) of FIG. 10A. A person skilled in the art would know of various methods and devices for providing such body ties in a transistor, some examples of which can be found, for example, in the above referenced U.S. patent application Ser. No. 14/945,323, and U.S. patent application Ser. No. 15/078,930, both entitled "Butted Body Contact for SOI Transistor", disclosures of which are incorporated herein by reference in their entirety. It should be noted that according to some exemplary embodiments, transistors of each of the stacks (M4, M3, M2, M1) and (M'4, M'3, M'2, M'1) may contain a combination of floating and body tied transistors, some such exemplary embodiments being described, for example, in the above referenced U.S. Pat. No. 9,882,531, issuing Jan. 30, 2018, entitled "Body Tie Optimization for Stacked Transistor Amplifier", the disclosure of which is incorporated herein by reference in its entirety. Applicant of the present disclosure have found that in the case of RF circuits, and in particular, in the case of RF amplifiers, contacts lengths used to tie bodies of the transistors (e.g., to a bias voltage, source of the transistor) can negatively influence performance of the amplifier, and therefore lengths of the contacts are reduced to maintain a desired performance. On the other hand, reducing such lengths can reduce efficiency of the body ties to the above described body effects. Such conflicting requirements for the length of the body ties make such body ties a less viable solution for solving the prior art problem stemming from activating and deactivating the current source (1030) during the active and standby modes of operation of the amplifier arrangement (1000A) of FIG. 10A. It follows that according to an embodiment of the present disclosure, the body potentials of the transistors (M'4, M'3, M'2, M'1) are maintained at normal operating levels during both the standby mode and the active mode of the amplifier arrangement (1000A), while reducing power consumption in the biasing circuit of the replica circuit by deactivating the current source (1030) and corresponding circuitry. FIG. 11 depicts one configuration that provides such functionality. Such embodiment can be used whether body tied or floating transistors are used.

FIG. 11 depicts an exemplary modification according to the present disclosure of the biasing circuit (1020, 1030) used to provide a bias to the replica circuit (1010). In the amplifier arrangement (1100) of FIG. 11, a switch (1140) is used to selectively couple and decouple, under control of the Ctrl signal, the drain of the transistor M'4 to the supply voltage $V_{DD}$. Accordingly, during the standby mode, the current source (1030) (and auxiliary circuitry) is deactivated and the switch (1140) is activated (switch is ON) to maintain the drain of the transistor M'4 to the voltage $V_{DD}$. At the same time, the $V_{G1}$ bias control module (1020) grounds the gate of the transistor M'1 to remove current conduction through the replica stack circuit (1010), while the gate biasing voltages $V'_{G4}, V'_{G3}, V'_{G2}$ distribute the voltage $V_{DD}$ across the transistors of the replica stack circuit (1010). During the active mode, the current source (1030) (and auxiliary circuitry) is activated to bias the drain of the transistor M'4 to $V_{DD}$ through the current source (1030), and the switch (1140) is deactivated (switch is OFF). As a result, during both the standby mode and the active mode, both stacks (M4, M3, M2, M1) and (M'4, M'3, M'2, M'1) are identically biased and therefore bodies of the corresponding transistors are at same potentials. A person skilled in the art would understand that when the current source (1030) is activated, a corresponding device/circuitry (e.g. transistor) can provide a low resistance path between the drain of the transistor M'4 and the supply voltage $V_{DD}$, while controlling the current through the device/circuitry, to effectively set the drain of M'4 to a voltage substantially equal to $V_{DD}$. On the other hand, when the current source (1030) is deactivated, said device/circuitry can be turned OFF, effectively removing the conduction path between the supply voltage $V_{DD}$ and the drain of M'4. As mentioned earlier, without connecting the drain of M'4 to a supply voltage (e.g., to $V_{DD}$, via switch 1140), as a result of the current source (1030) being deactivated, natural conductance current (from drain to source) discharges a voltage at the drain of M'4 and all the drains of subsequent transistors M'3, M'2 and M'1, ultimately resulting in grounding the drains of the transistors (M'4, M'3, M'2, M'1).

With continued reference to FIG. 11, according to some embodiments of the present disclosure, gate biasing voltages $V'_{G4}, V'_{G3}, V'_{G2}$ to the gates of the transistors (M'4, M'3, M'2) of the replica circuit (1010) can be made to be exactly the same (equal) in both the standby and the active modes of operation, as described above. According to alternative embodiments of the present disclosure, the gate biasing voltages $V'_{G4}, V'_{G3}, V'_{G2}$ can be made to be substantially equal in the two modes of operation, such as, for example, a voltage division of the voltage at the drain of the transistor M'4 across the stack (1010), provides voltages at the common source-drain nodes of the transistors (M'4, M'3, M'2, M'1) of the stack (1010) in the standby mode of operation that are within 0.5 V of respective common source-drain nodes voltages in the active mode of operation. In other words, for $V'_{Gn}|_{standby} \approx V'_{Gn}|_{active} +/- 0.5$ V, for n=2, 3, 4. According to further embodiments of the present disclosure, gate biasing voltages $V'_{G4}, V'_{G3}, V'_{G2}$ provided to the replica circuit (1010) can be made to be substantially equal to respective gate biasing voltages $V_{G4}, V_{G3}, V_{G2}$ provided to the transistors of the amplification stage.

With further reference to the amplifier arrangement (1100) according to the present disclosure depicted in FIG. 11, since the current source (1030) and auxiliary circuitry are deactivated and no current is conducted through the replica circuit (1010) during the standby mode, a reduction in power consumption during the standby mode as compared to the active mode can be obtained. In addition, body effects discussed above are eliminated allowing the amplifier arrangement (1100) of FIG. 11 to switch between operations from the standby mode to the active mode without suffering from the long settling time of the body potentials during which the amplifier does not perform as intended. Applicant of the present disclosure have measured settling times equal to or less than 200 nanoseconds, providing a large margin of operation of the amplifier arrangement (1100) of FIG. 11 with respect to standard timing windows by which a controller (e.g., transceiver unit) may start outputting the $RF_{in}$ signal to the amplifier arrangement (1100) subsequent to a request to switch operation from standby mode to active mode.

Although the exemplary embodiment according to the present disclosure depicted in FIG. 11 shows a simple switch (1140), independent form the current source (1030), as a means to selectively bias the drain of the transistor M'4 to the voltage $V_{DD}$, a person skilled in the art would know of other means to provide a same functionality, while using the teachings according to the present disclosure. For example, considering the entire current source (1030) and corresponding auxiliary circuitry (not shown, but described, for example, in the above referenced Published US Application No. 2015/0270806 A1, the disclosure of which is incorporated herein by reference in its entirety), a person skilled in the art may be able to integrate same functionality of the switch (1140) within such current source (1030) and auxiliary circuitry, as depicted in FIG. 12A.

Figure 12A:
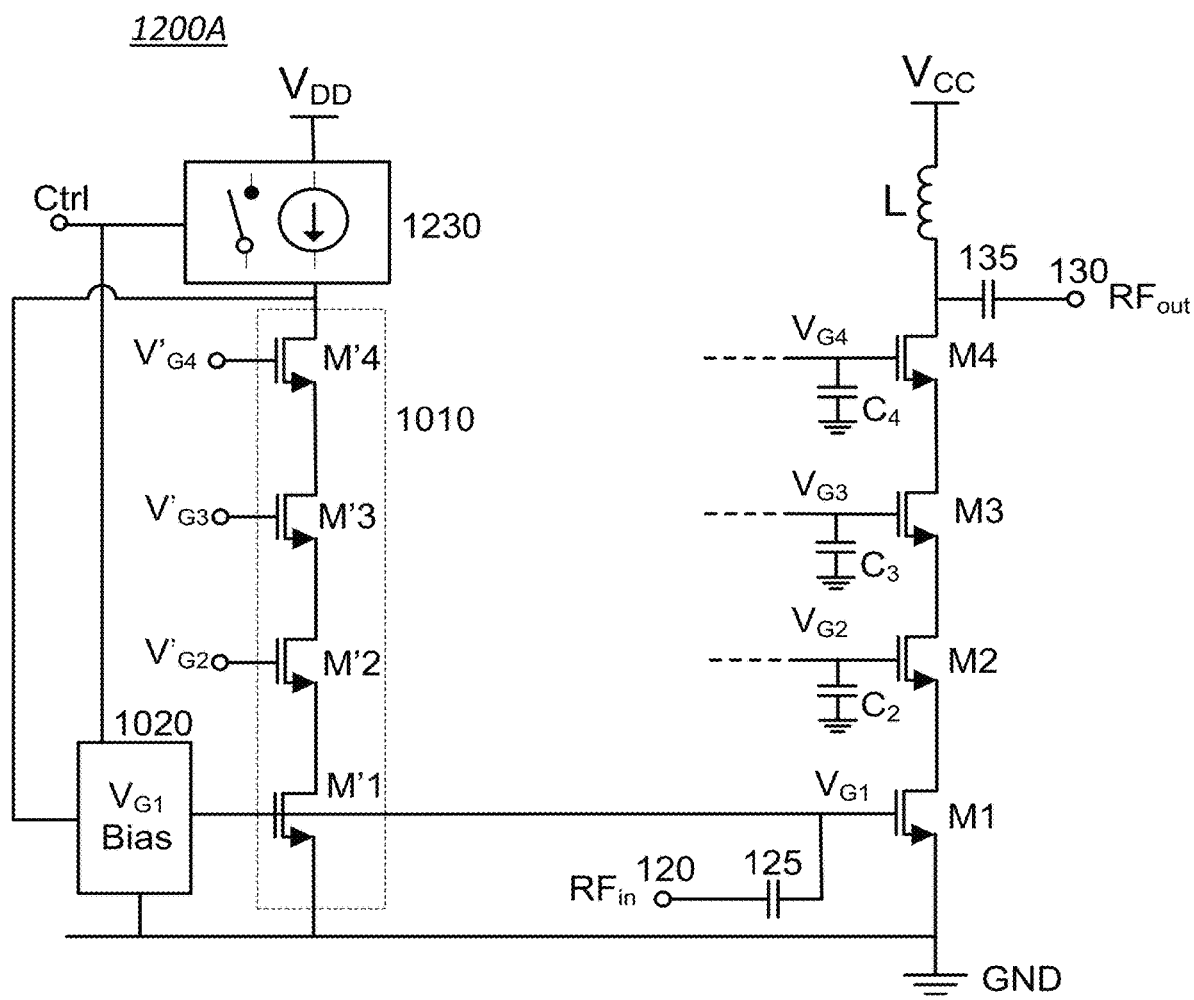
FIG. 12A and FIG. 12B show alternative configurations to the configuration depicted in FIG. 11 while providing a same functionality.

With further reference to FIG. 12A, an amplifier arrangement (1200A) according to an embodiment of the present disclosure is depicted which can provide a same functionality as the amplifier arrangement (1100) discussed above with reference to FIG. 11. In particular, a drain bias module (1230) is used to selectively couple the drain of the transistor M'4 to a node whose voltage remains constant (e.g., $V_{DD}$) during a first mode and a second mode of operation, and whose current sourcing is controlled to a reference current (e.g., $I_{REF}$) during the first mode of operation (e.g., active mode) and whose current sourcing is not controlled during the second mode of operation (e.g. standby mode). As discussed above with reference to FIG. 11, such functionality may be implemented by usage of a current source (e.g., 1030), a switch (e.g., 1140) and corresponding auxiliary circuitry. Furthermore, portion of circuitry of the drain bias module (1230) used for the limiting of the current to the reference current, $I_{REF}$, may be disabled during the standby mode of operation for a reduction in power consumed.

Figure 12B:
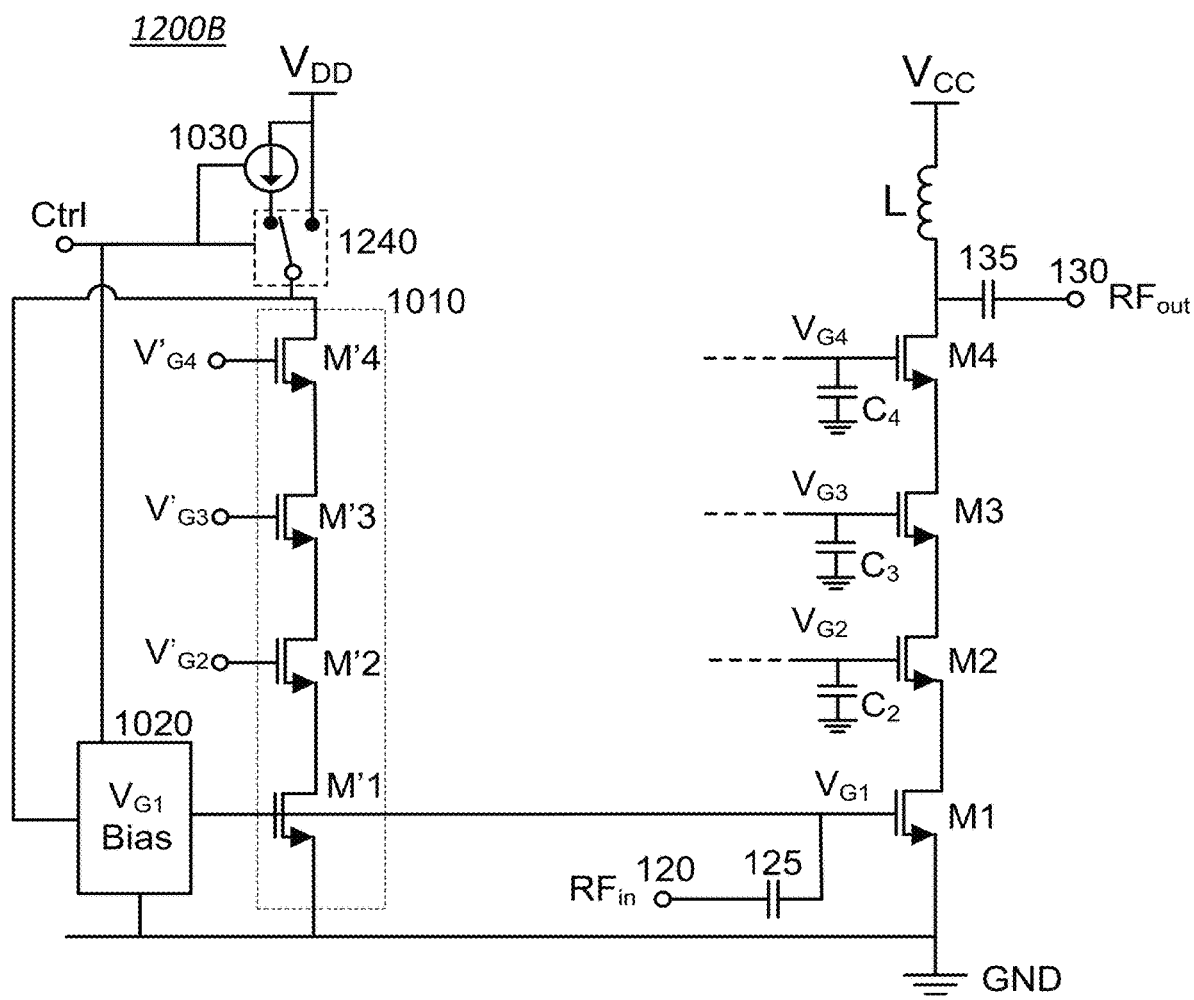

FIG. 12B shows yet another exemplary implementation of an amplifier arrangement (1200B) according to a further embodiment of the present disclosure which can provide a same functionality as the amplifier arrangement (1100) discussed above with reference to FIG. 11. In particular, a switch (1240) is used to couple one of the supply voltage $V_{DD}$ and the current source (1030) to the drain node of the transistor M'4 of the replica circuit (1010). As discussed above, using the teachings according to the present disclosure, a person skilled in the art would know of multitude of ways to modify the biasing circuit that uses a replica circuit (e.g., FIG. 10A and FIG. 10B) so as to maintain body potentials of the replica circuit same as the body potentials of the main amplification stage during both the standby mode and the active mode of operations, while reducing power consumption during the standby mode. As noted throughout the present disclosure, the stacked transistor configurations depicted to have four transistors that are stacked are just exemplary in nature as the teaching according to the present disclosure equally apply to configurations having different number of stacked transistors, such as 2, 3, 4, 5, 6, 7, and larger.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHZ, and particularly above about 20 GHZ). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functions without significantly altering the functionality of the disclosed circuits.

The examples set forth above are provided to give those of ordinary skill in the art a complete disclosure and description of how to make and use the embodiments of the standby voltage condition for fast RF amplifier bias recovery of the present disclosure, and are not intended to limit the scope of what the applicant considers to be the invention. Such embodiments may be, for example, used within mobile handsets for current communication systems (e.g. WCMDA, LTE, WiFi, etc.) wherein amplification of signals with frequency content of above 100 MHz and at power levels of above 50 mW may be required. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. A circuital arrangement comprising:
a first transistor stack comprising a plurality of stacked transistors comprising an input transistor and an output transistor; and
a biasing circuit comprising a second transistor stack comprising a plurality of stacked transistors comprising a first transistor and a last transistor, the biasing circuit configured to provide an input gate biasing voltage to the input transistor and to the first transistor,
wherein the biasing circuit further comprises a drain biasing circuit configured to bias a drain of the last transistor,
wherein during a first mode of operation of the circuital arrangement, the drain biasing circuit couples said drain to a first supply voltage through a current source configured to source a reference current that is conducted through the second transistor stack, and
wherein during a second mode of operation of the circuital arrangement, the drain biasing circuit couples said drain to the first supply voltage while bypassing the current source.

2. The circuital arrangement according to claim 1, wherein:
during the second mode of operation, the drain biasing circuit couples said drain to the first supply voltage through a low impedance conduction path that does not include the current source.

3. The circuital arrangement according to claim 1, wherein the drain biasing circuit further comprises a switch configured to selectively couple said drain to the current source or to the first supply voltage.

4. The circuital arrangement according to claim 3, wherein the current source comprises a first node connected to the switch and a second node connected to the first supply voltage.

5. The circuital arrangement according to claim 1, wherein the drain biasing circuit further comprises a switch configured to selectively couple said drain to the first supply voltage.

6. The circuital arrangement according to claim 5, wherein during the first mode of operation,
the switch is closed to provide a low impedance conduction path between the first supply voltage and said drain, and
the current source is deactivated to provide a high impedance conduction path between the first supply voltage and the said drain.

7. The circuital arrangement according to claim 5, wherein during the second mode of operation,
the switch is open to provide a high impedance conduction path between the first supply voltage and said drain, and
the current source is activated to provide a low impedance conduction path between the first supply voltage and the said drain for conduction of the reference current.

8. The circuital arrangement according to claim 1, wherein:
during the first mode of operation, the biasing circuit generates the input gate biasing voltage based on the reference current conducted through the second transistor stack.

9. The circuital arrangement according to claim 1, wherein:
during the first mode of operation, the biasing circuit regulates the input gate biasing voltage so that the reference current is conducted through the second transistor stack.

10. The circuital arrangement according to claim 9, wherein the biasing circuit regulates the input gate biasing voltage based on a voltage sensed at the second transistor stack.

11. The circuital arrangement according to claim 9, wherein the biasing circuit regulates the input gate biasing voltage based on a voltage sensed at the drain of the last transistor.

12. The circuital arrangement according to claim 1, wherein:
during the second mode of operation, the biasing circuit generates the input gate biasing voltage for no current conducted through the first and second transistor stack.

13. The circuital arrangement according to claim 1, wherein:
during the second mode of operation, the biasing circuit generates the input gate biasing voltage to be substantially equal to a reference ground coupled to the input transistor and the first transistor.

14. The circuital arrangement according to claim 1, wherein:
the first mode of operation is an active mode of operation for conduction of a biasing current through the first transistor stack based on the reference current conducted through the second transistor stack, and
the second mode of operation is a standby mode for essentially no conduction of current through the first transistor stack and the second transistor stack.

15. The circuital arrangement according to claim 1, wherein biasing voltages to gates of the plurality of stacked transistors of the second transistor stack except the first transistor during the first mode of operation are substantially equal to respective biasing voltages to the gates of the plurality of stacked transistors of the second transistor stack except the first transistor during the second mode of operation.

16. The circuital arrangement according to claim 1, wherein biasing voltages to gates of the plurality of stacked transistors of the first transistor stack except the input transistor during the first mode of operation are substantially equal to respective biasing voltages to the gates of the plurality of stacked transistors of the first transistor stack except the input transistor during the second mode of operation.

17. The circuital arrangement according to claim 1, wherein:
a drain of the output transistor of the first transistor stack is coupled to a second supply voltage, and
the first supply voltage is equal to the second supply voltage.

18. The circuital arrangement according to claim 1, wherein:
a drain of the output transistor of the first transistor stack is coupled to a second supply voltage, and the first supply voltage is different form the second supply voltage.

19. The circuital arrangement according to claim 1, wherein:

during the first mode of operation, biasing voltages to respective gates of the plurality of stacked transistors of the second transistor stack are substantially equal to biasing voltages to the respective gates of the plurality of stacked transistors of the first transistor stack.

20. The circuital arrangement according to claim 1, wherein:

during the second mode of operation, biasing voltages to respective gates of the plurality of stacked transistors of the second transistor stack are substantially equal to biasing voltages to the respective gates of the plurality of stacked transistors of the first transistor stack.

21. The circuital arrangement according to claim 1, wherein:

during the first mode of operation, biasing voltages to respective gates of the plurality of stacked transistors of the second transistor stack are different from biasing voltages to the respective gates of the plurality of stacked transistors of the first transistor stack.

22. The circuital arrangement according to claim 1, wherein:

during the second mode of operation, biasing voltages to respective gates of the plurality of stacked transistors of the second transistor stack are different from biasing voltages to the respective gates of the plurality of stacked transistors of the first transistor stack.

23. The circuital arrangement according to claim 1, wherein a number of the plurality of stacked transistors of the second transistor stack is equal to a number of the plurality of stacked transistors of the first transistor stack.

24. The circuital arrangement according to claim 1, wherein a number of the plurality of stacked transistors of the second transistor stack is different from a number of the plurality of stacked transistors of the first transistor stack.

25. The circuital arrangement according to claim 1, wherein the plurality of stacked transistors of the first and second transistor stacks are floating body transistors.

26. The circuital arrangement according to claim 1, wherein the plurality of stacked transistors of the first and second transistor stacks are body tied transistors.

27. The circuital arrangement according to claim 1, wherein the plurality of stacked transistors of the first and/or second transistor stacks comprise a combination of body tied transistors and floating body transistors.

* * * * *